United States Patent
Cho et al.

(10) Patent No.: US 9,123,677 B2
(45) Date of Patent: Sep. 1, 2015

(54) ORGANIC LIGHT-EMITTING DISPLAY APPARATUS

(71) Applicant: SAMSUNG DISPLAY CO., LTD., Yongin, Gyeonggi-Do (KR)

(72) Inventors: Young-Jin Cho, Yongin (KR); Young-In Hwang, Yongin (KR); Dong-Gyu Kim, Yongin (KR)

(73) Assignee: Samsug Display Co., Ltd., Yongin-si (KR)

( * ) Notice: Subject to any disclaimer, the term of this patent is extended or adjusted under 35 U.S.C. 154(b) by 0 days.

(21) Appl. No.: 14/270,254

(22) Filed: May 5, 2014

(65) Prior Publication Data

US 2015/0108437 A1  Apr. 23, 2015

(30) Foreign Application Priority Data

Oct. 22, 2013  (KR) ........................ 10-2013-0126115

(51) Int. Cl.
*H01L 51/52* (2006.01)
*H01L 51/56* (2006.01)
*H01L 27/32* (2006.01)

(52) U.S. Cl.
CPC .................................. *H01L 27/3248* (2013.01)

(58) Field of Classification Search
None
See application file for complete search history.

(56) References Cited

U.S. PATENT DOCUMENTS

| | | | |
|---|---|---|---|
| 6,697,037 B1* | 2/2004 | Alt et al. .......................... | 345/93 |
| 2005/0236620 A1 | 10/2005 | Yamada | |
| 2011/0205249 A1* | 8/2011 | Yoshida et al. ............... | 345/690 |
| 2011/0275270 A1* | 11/2011 | Matsuoka et al. ................ | 445/2 |
| 2013/0176194 A1* | 7/2013 | Jin et al. .......................... | 345/76 |
| 2013/0293236 A1* | 11/2013 | Lee et al. ...................... | 324/414 |
| 2014/0117860 A1* | 5/2014 | Kim et al. .................. | 315/169.1 |
| 2014/0240304 A1* | 8/2014 | In et al. ......................... | 345/212 |
| 2014/0292827 A1* | 10/2014 | Kang et al. .................... | 345/690 |
| 2014/0313106 A1* | 10/2014 | In et al. .......................... | 345/76 |
| 2014/0346475 A1* | 11/2014 | Cho et al. ........................ | 257/40 |
| 2014/0347401 A1* | 11/2014 | Hwang et al. ................. | 345/690 |
| 2014/0354700 A1* | 12/2014 | Hong ............................ | 345/690 |

FOREIGN PATENT DOCUMENTS

| | | |
|---|---|---|
| JP | 2007-316511 A | 12/2007 |
| JP | 2010-019963 A | 1/2010 |
| KR | 10-2006-0044758 A | 5/2006 |
| KR | 10-2011-0023028 A | 3/2011 |

* cited by examiner

*Primary Examiner* — Joseph Schoenholtz

(74) *Attorney, Agent, or Firm* — Christie, Parker & Hale LLP

(57) ABSTRACT

An organic light-emitting display apparatus includes an emission pixel in a display area and a spare pixel circuit in a repair area outside the display area. The emission pixels includes a plurality of sub emission pixels each including a driving unit for generating a driving current corresponding to input data signals and an emission device for emitting light by using the driving current. The spare pixel circuit is coupled to a repair line that is coupled to the emission device of one of the sub emission pixels. The spare pixel circuit includes a plurality of driving transistors corresponding to the plurality of sub emission pixels.

20 Claims, 20 Drawing Sheets

ORGANIC LIGHT-EMITTING DISPLAY APPARATUS

CROSS-REFERENCE TO RELATED APPLICATIONS

This application claims priority to and the benefit of Korean Patent Application No. 10-2013-0126115, filed on Oct. 22, 2013 in the Korean Intellectual Property Office, the entire content of which is incorporated herein by reference.

BACKGROUND

1. Field

Aspects of one or more embodiments of the present invention relate to an organic light-emitting display apparatus.

2. Description of the Related Art

An organic light-emitting display apparatus displays an image by using organic light-emitting diodes (OLEDs) that are light-emitting devices whose brightness is controlled according to currents or voltages. Depending on factors such as its design and intended use, an organic light-emitting display apparatus may have a complex pixel circuit and a difficult manufacturing processing. Consequently, yield of large-sized and high-resolution organic light-emitting display apparatuses may be reduced.

SUMMARY

One or more embodiments of the present invention provide for an organic light-emitting display apparatus capable of reducing dead space by reducing or minimizing space for which spare pixel circuits are used to repair defective pixels.

In an embodiment of the present invention, an organic light-emitting display apparatus is provided. The organic light-emitting display apparatus includes an emission pixel in a display area and a spare pixel circuit in a repair area outside the display area. The emission pixel includes a plurality of sub emission pixels each including a driving unit for generating a driving current corresponding to input data signals and an emission device for emitting light by using the driving current. The spare pixel circuit is coupled to a repair line that is coupled to the emission device of one of the sub emission pixels. The spare pixel circuit includes a plurality of driving transistors corresponding to the plurality of sub emission pixels.

The spare pixel circuit may include a first driving unit for generating the driving current corresponding to the input data signals, a second driving unit for transferring the driving current from the first driving unit to the emission device coupled to the repair line, and a plurality of dummy emission devices corresponding to the plurality of sub emission pixels.

The first driving unit may include: the plurality of driving transistors, one of the driving transistors corresponding to the one of the sub emission pixels and including a gate electrode coupled to a first node, a first electrode coupled to a first power voltage source, and a second electrode coupled to a third node; a switching transistor including a gate electrode coupled to a scan line, a first electrode coupled to a data line, and a second electrode coupled to a second node; a compensation transistor including a gate electrode coupled to a first control line, a first electrode coupled to the first node, and a second electrode coupled to the third node; a storage capacitor including a first electrode coupled to the first power voltage source and a second electrode coupled to the second node; and a compensation capacitor including a first electrode coupled to the first node and a second electrode coupled to the second node.

The plurality of driving transistors, excluding the one of the driving transistors, may be disabled.

The storage capacitor may include a plurality of storage capacitors corresponding to the plurality of sub emission pixels, one of the storage capacitors corresponding to the one of the sub emission pixels and including the first electrode coupled to the first power voltage source and the second electrode coupled to the second node. The plurality of storage capacitors, excluding the one of the storage capacitors, may be disabled.

The second driving unit may include: a first repair transistor configured to turn on during an emission period of the emission pixel and electrically connect the first driving unit and the repair line; a second repair transistor between the first driving unit and the dummy emission devices, and configured to turn on during a non-emission period of the emission pixel and turn off during the emission period of the emission pixel; and a third repair transistor configured to turn on during a pre-emission period just before the emission period and initialize a driving voltage of a previous frame supplied to the repair line.

The third repair transistor may include a plurality of third repair transistors corresponding to the plurality of sub emission pixels, one of the third repair transistors corresponding to the one of the sub emission pixels and being configured to turn on during the pre-emission period and initialize the driving voltage of the previous frame supplied to the repair line. The plurality of third repair transistors, excluding the one of the third repair transistors, may be disabled.

The first repair transistor may include a gate electrode coupled to a first repair control line, a first electrode coupled to the first driving unit, and a second electrode coupled to the repair line. The second repair transistor may include a gate electrode coupled to a second repair control line, a first electrode coupled to the first driving unit, and a second electrode coupled to the dummy emission devices. The third repair transistor may include a gate electrode coupled to a third repair control line, a first electrode coupled to the first driving unit, and a second electrode coupled to the gate electrode of the third repair transistor.

The first driving unit may include: the plurality of driving transistors, one of the driving transistors corresponding to the one of the sub emission pixels and including a gate electrode coupled to a first node, a first electrode coupled to a first power voltage source, and a second electrode coupled to a third node; a switching transistor including a gate electrode coupled to a scan line, a first electrode coupled to a data line, and a second electrode coupled to a fourth node; a compensation transistor including a gate electrode coupled to a first control line, a first electrode coupled to the first node, and a second electrode coupled to the third node; a relay transistor including a gate electrode coupled to a second control line, a first electrode coupled to the fourth node, and a second electrode coupled to a second node; a hold transistor including a gate electrode coupled to the first control line, a first electrode coupled to the data line, and a second electrode coupled to the second node; a storage capacitor including a first electrode coupled to the first power voltage source and a second electrode coupled to the second node; a compensation capacitor including a first electrode coupled to the first node and a second electrode coupled to the second node; and a hold capacitor including a first electrode coupled to the fourth node and a second electrode coupled to a reference voltage source.

The plurality of driving transistors, excluding the one of the driving transistors, may be disabled.

The storage capacitor may include a plurality of storage capacitors corresponding to the plurality of sub emission pixels, one of the storage capacitors corresponding to the one of the sub emission pixels and including the first electrode coupled to the first power voltage source and the second electrode coupled to the second node. The hold capacitor may include a plurality of hold capacitors corresponding to the plurality of sub emission pixels, one of the hold capacitors corresponding to the one of the sub emission pixels and including the first electrode coupled to the fourth node and the second electrode coupled to the reference voltage source. The plurality of storage capacitors, excluding the one of the storage capacitors, may be disabled. The plurality of hold capacitors, excluding the one of the hold capacitors, may be disabled.

The first driving unit may include: the plurality of driving transistors, one of the driving transistors corresponding to the one of the sub emission pixels and including a gate electrode coupled to a first node, a first electrode coupled to a first power voltage source, and a second electrode coupled to a third node; a switching transistor including a gate electrode coupled to a scan line, a first electrode coupled to a reference voltage source, and a second electrode coupled to a fourth node; a compensation transistor including a gate electrode coupled to a first control line, a first electrode coupled to the first node, and a second electrode coupled to the third node; a relay transistor including a gate electrode coupled to a second control line, a first electrode coupled to the fourth node, and a second electrode coupled to a second node; a hold transistor including a gate electrode coupled to a third control line, a first electrode coupled to the first power voltage source, and a second electrode coupled to the second node; a storage capacitor including a first electrode coupled to the first node and a second electrode coupled to the second node; and a hold capacitor including a first electrode coupled to a data line and a second electrode coupled to the fourth node.

The plurality of driving transistors, excluding the one of the driving transistors, may be disabled.

The storage capacitor may include a plurality of storage capacitors corresponding to the plurality of sub emission pixels, one of the storage capacitors corresponding to the one of the sub emission pixels and including the first electrode coupled to the first node and the second electrode coupled to the second node. The hold capacitor may include a plurality of hold capacitors corresponding to the plurality of sub emission pixels, one of the hold capacitors corresponding to the one of the sub emission pixels and including the first electrode coupled to the data line and the second electrode coupled to the reference voltage source. The plurality of storage capacitors, excluding the one of the storage capacitors, may be disabled. The plurality of hold capacitors, excluding the one of the hold capacitors, may be disabled.

In another embodiment of the present invention, an organic light-emitting display apparatus is provided. The organic light-emitting display apparatus includes an emission pixel, a spare pixel circuit, and a repair line. The emission pixel includes a plurality of sub emission pixels each including a driving unit for generating a driving current corresponding to input data signals, and an emission device configured to emit light by using the driving current. The spare pixel circuit includes: a first driving unit including a plurality of driving transistors corresponding to the plurality of sub emission pixels; a second driving unit for controlling a current path between the first driving unit and an emission device of one of the sub emission pixels; and a plurality of dummy emission devices corresponding to the plurality of sub emission pixels, one of the dummy emission devices corresponding to the one of the sub emission pixels being insulated from, and configured to be electrically connected to, the second driving unit. The repair line is insulated from, and configured to be electrically connected to, the spare pixel circuit and the emission device of the one of the sub emission pixels.

The emission pixel may be in a display area. The spare pixel circuit may be in a repair area outside the display area. The spare pixel circuit may be coupled to a repair scan line in the repair area. The repair scan line may be a scan line before a first scan line or after a last scan line among a plurality of scan lines of the display area.

In yet another embodiment of the present invention, an organic light-emitting display apparatus is provided. The organic light-emitting display apparatus includes an emission pixel, a spare pixel circuit, and a repair line. The emission pixel includes a plurality of sub emission pixels each including a driving unit for generating a driving current corresponding to input data signals, and an emission device configured to emit light by using the driving current. The spare pixel circuit includes: a first driving unit including a plurality of driving transistors corresponding to the plurality of sub emission pixels; a second driving unit for controlling a current path between the first driving unit and an emission device of one of the sub emission pixels; and a plurality of dummy emission devices corresponding to the plurality of sub emission pixels, one of the dummy emission devices corresponding to the one of the sub emission pixels being electrically connected to the second driving unit. The repair line is electrically connected to the spare pixel circuit and the emission device of the one of the sub emission pixels.

The one of the sub emission pixels may be a defective sub emission pixel. The second driving unit may be electrically connected to the repair line. The plurality of driving transistors, excluding one of the driving transistors corresponding to the defective sub emission pixel, may be disabled. The second driving unit may be configured to supply a driving current from the one of the driving transistors to the repair line.

The one of the sub emission pixels may be a defective sub emission pixel. The first driving unit may include a plurality of capacitors corresponding to the plurality of sub emission pixels. The plurality of capacitors, excluding one of the capacitors corresponding to the defective sub emission pixel, may be disabled.

The second driving unit may include: a first repair transistor configured to turn on during an emission period of the emission pixel and electrically connect the first driving unit to the repair line; a second repair transistor between the first driving unit and the dummy emission devices, and configured to turn on during a non-emission period of the emission pixel and to turn off during the emission period of the emission pixel; and a third repair transistor configured to turn on during a pre-emission period just before the emission period and to initialize a driving voltage of a previous frame supplied to the repair line.

Additional aspects will be set forth in part in the description that follows and, in part, will be apparent from the description to one of ordinary skill, or may be learned by practice of the presented embodiments.

BRIEF DESCRIPTION OF THE DRAWINGS

These and other aspects will become more apparent and more readily appreciated from the following description of example embodiments, taken in conjunction with the accompanying drawings in which.

DETAILED DESCRIPTION

Figure 1:
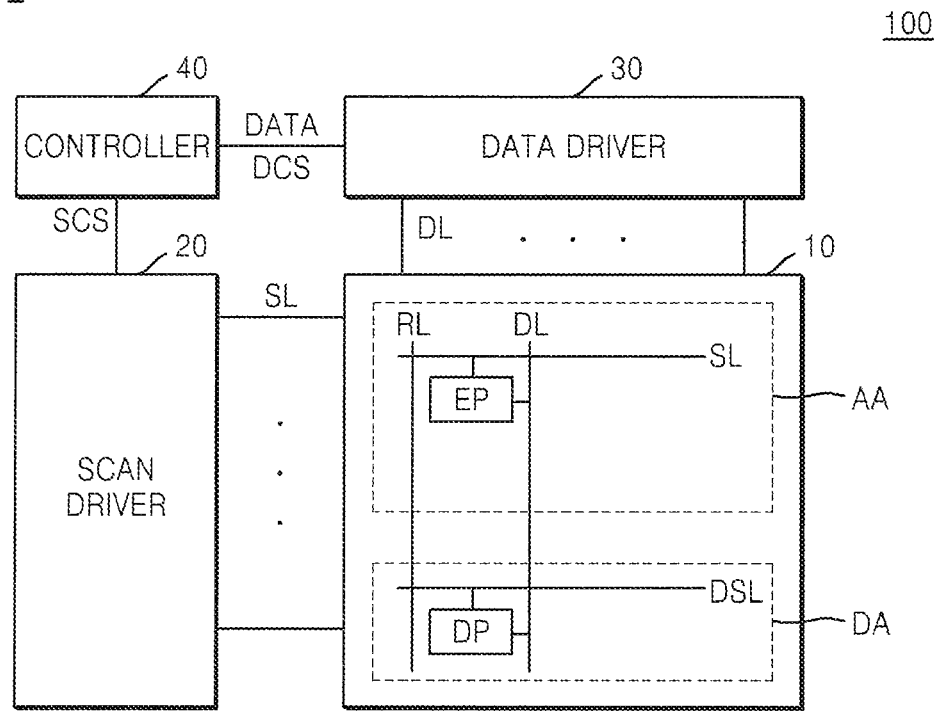
FIG. 1 is a schematic block diagram of a display apparatus according to an embodiment of the present invention.

Reference will now be made in detail to example embodiments of the present invention as illustrated in the accompanying drawings, wherein like reference numerals refer to like elements throughout. In this regard, the present invention may have different embodiments and should not be construed as being limited to the embodiments set forth herein. Accordingly, the embodiments are merely described below, by referring to the figures, to explain aspects of the present invention. Expressions such as "at least one of," when preceding a list of elements, modify the entire list of elements and do not modify the individual elements of the list.

It will be understood that although the terms "first," "second," etc., may be used herein to describe various components, these components should not be limited by these terms. These components are only used to distinguish one component from another. As used herein, the singular forms "a," "an," and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

In addition, when a first element is described as being "coupled" to a second element, the first element may be directly coupled (e.g., connected) to the second element or indirectly coupled (e.g., electrically connected) to the second element through one or more third elements. Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

FIG. 1 is a schematic block diagram of a display apparatus 100 according to an embodiment of the present invention.

Referring to FIG. 1, the display apparatus 100 includes a display panel 10, a scan driver 20, a data driver 30, and a controller 40. The scan driver 20, the data driver 30, and the controller 40 may be separately formed on different semiconductor chips, or may be integrated on one semiconductor chip. The scan driver 20 may be formed on the same substrate as the display panel 10.

A display area AA and a repair area DA around or next to one or more sides (or otherwise outside) of the display area AA may be formed in the display panel 10. For example, the repair area DA may be formed next to at least one of an upper side and a lower side of the display area AA. A plurality of emission pixels EP that are coupled to scan lines SL and data lines DL are arranged in the display area AA. A plurality of spare pixel circuits DP that are coupled to a repair scan line DSL and the data lines DL are arranged in the repair area DA. A plurality of repair lines RL may be provided on the display panel 10 in parallel with the data lines DL in each pixel column. The repair lines RL couple emission devices of the defective emission pixels EP to the spare pixel circuits DP. The repair lines RL may provide paths used to supply driving currents generated by the spare pixel circuits DP to the defective emission pixels EP.

The scan driver 20 may generate and sequentially provide scan signals via the scan lines SL to the emission pixels EP. The scan driver 20 may generate and sequentially provide repair scan signals via the repair scan line DSL to the spare pixel circuits DP. The repair scan line DSL may, for example, be a scan line before a first scan line of the display area AA or a scan line after a last scan line thereof. Thus, the repair scan signals may be earlier scan signals of a first scan signal of the display area AA or later scan signals of a last scan signal thereof.

The data driver 30 may sequentially provide data signals via the data lines DL to the emission pixels EP. The data driver 30 transforms input image data DATA input from the controller 40 and having various gray levels into voltage or current data signals.

When an emission pixel EP is defective, a repair process is undertaken. The emission device of the defective emission pixel EP and a spare pixel circuit DP of the same pixel column as the defective emission pixel EP are coupled (e.g., electrically connected) to a repair line RL of the same pixel column. This way, a data signal that is the same as the data signal supplied to (or to be supplied to) the defective emission pixel EP is instead supplied to the spare pixel circuit DP. The spare pixel circuit DP then generates and supplies a corresponding driving current to the repair line RL so that the defective emission pixel EP coupled to the repair line RL may emit light as if the emission pixel EP were not defective.

The controller 40 generates and transmits scan control signals SCS and data control signals DCS to the scan driver 20 and the data driver 30, respectively. Accordingly, the scan driver 20 sequentially supplies scan signals to the scan lines SL and the repair scan line DSL, and the data driver 30 supplies data signals to the emission pixels EP and the spare pixel circuits DP in synchronization with the scan signals. In addition, as illustrated in later drawings, a first power voltage ELVDD, a second power voltage ELVSS, a reference voltage Vref, a plurality of control signals GC, GW, GS, and GE, and the like may be provided to the emission pixels EP and the spare pixel circuits DP under the control of the controller 40 according to structures of pixels and driving methods of the display apparatus 100.

Figure 2:
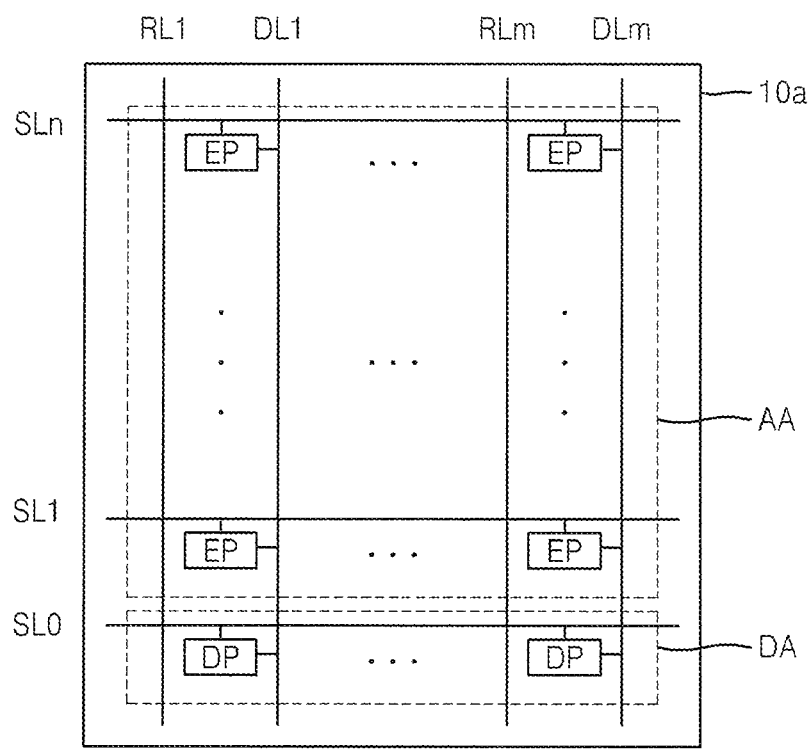
FIGS. 2 through 4 are schematic diagrams of examples of a display panel illustrated in FIG. 1.
Figure 3:
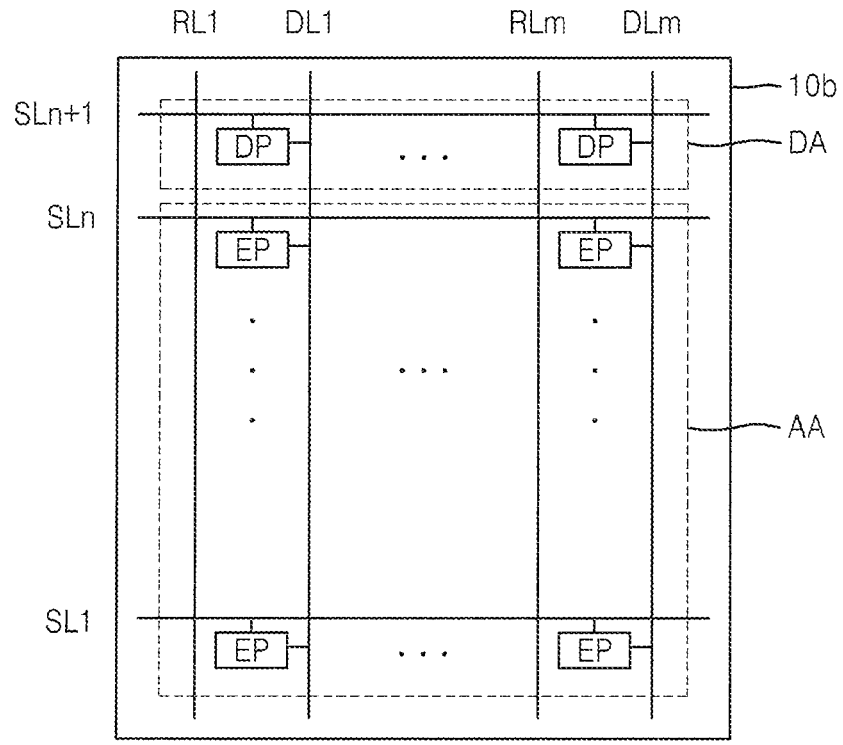
Figure 4:
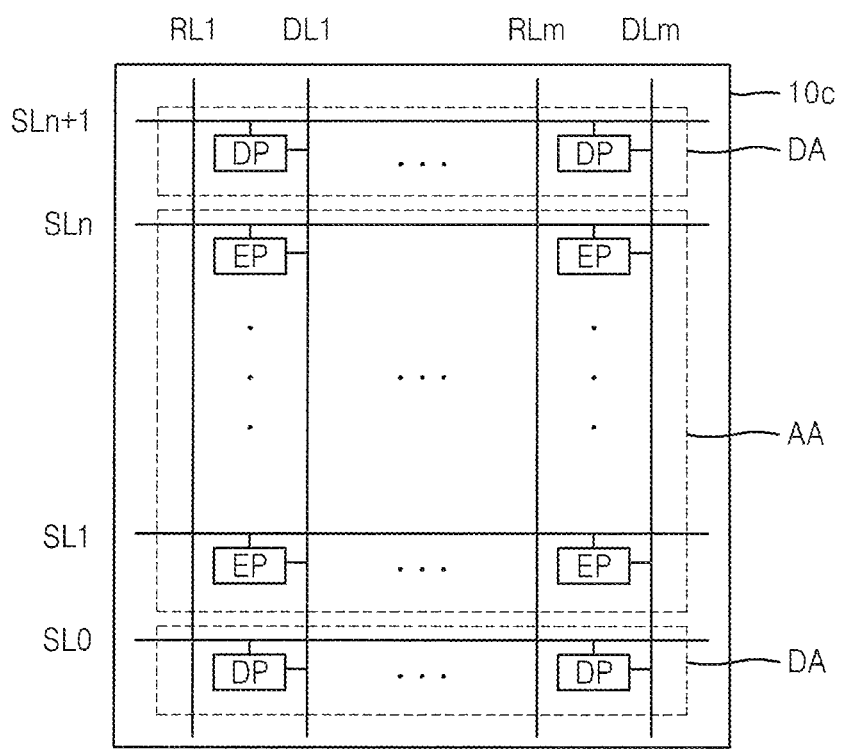

FIGS. 2 through 4 are schematic diagrams of example display panels 10a through 10c, respectively, of the display panel 10 illustrated in FIG. 1.

The repair area DA may be formed on at least one of top and bottom regions or left and right regions of the display area AA. As such, the spare pixel circuits DP may be formed in each pixel column on at least one of top and bottom regions of the pixel column, or the spare pixel circuits DP may be formed in each pixel row on at least one of left and right regions of the pixel row. An example of forming the spare pixel circuits DP in each of the pixel columns of the repair area DA on the top and bottom regions of the display area AA is described with respect to FIGS. 2 through 4. This technique may also be applied to similar display panels where the spare pixel circuits DP are (instead or in addition) formed in each of the pixel rows of the repair area DA on the left and right regions of the display area AA, as would be apparent to one of ordinary skill.

However, the present invention is not limited thereto. In other embodiments, the spare pixel circuits DP may be formed next to the display area AA by repeatedly extending in a row direction or in a column direction for each of tens or hundreds of pixel rows or columns.

Referring to FIG. 2, a plurality of scan lines SL1 through SLn, a plurality of data lines DL1 through DLm, a plurality of repair lines RL1 through RLm, and a repair scan line SL0 are formed on a display panel 10a. The emission pixels EP that are coupled to the scan lines SL1 through SLn and the data lines DL1 through DLm are formed in the display area AA. The spare pixel circuits DP that are coupled to the repair scan line SL0 and the data lines DL1 through DLm are formed in the repair area DA.

The repair scan line SL0 may be a $0^{th}$ scan line before the first scan line SL1 of the display area AA, and may receive a $0^{th}$ scan signal prior to a first scan signal supplied to the first scan line SL1. The data lines DL1 through DLm and the repair lines RL1 through RLm are formed in the display area AA and the repair area DA for each pixel column.

Referring to FIG. 3, the scan lines SL1 through SLn, the data lines DL1 through DLm, the repair lines RL1 through RLm, and a repair scan line SLn+1 are formed on a display panel 10b. The emission pixels EP that are coupled to the scan lines SL1 through SLn and the data lines DL1 through DLm are formed in the display area M. The spare pixel circuits DP that are coupled to the repair scan line SLn+1 and the data lines DL1 through DLm are formed in the repair area DA.

The repair scan line SLn+1 may be a (n+1)th scan line after the last (nth) scan line SLn of the display area AA, and may receive a (n+1)th scan signal after a nth scan signal supplied to the last (nth) scan line SLn. The data lines DL1 through DLm and the repair lines RL1 through RLm are formed in the display area AA and the repair area DA for each pixel column.

Referring to FIG. 4, the scan lines SL1 through SLn, the data lines DL1 through DLm, the repair lines RL1 through RLm, and the first and second repair scan lines SL0 and SLn+1 are formed on a display panel 10c. The emission pixels EP that are coupled to the scan lines SL1 through SLn and the data lines DL1 through DLm are formed in the display area AA. The spare pixel circuits DP that are coupled to the first and second repair scan lines SL0 and SLn+1 and the data lines DL1 through DLm are formed in the repair areas DA, which are adjacent to top and bottom sides of the display area AA.

The first repair scan line SL0 may be the $0^{th}$ scan line before the first scan line SL1 of the display area AA, and may receive the $0^{th}$ scan signal prior to the first scan signal supplied to the first scan line SL1. The second repair scan line SLn+1 may be the (n+1)th scan line after the last (nth) scan line SLn of the display area AA, and may receive the (n+1)th scan signal after the nth scan signal supplied to the last (nth) scan line SLn. The data lines DL1 through DLm and the repair lines RL1 through RLm are formed in the display area AA and the repair area DA for each pixel column.

Although one or two spare pixel circuits DP are formed in the repair area DA for each pixel column in FIGS. 2 through 4, the present invention is not limited thereto. In other embodiments, three or more spare pixel circuits DP may be formed in the repair area DA for each pixel column or pixel row.

Figure 5:
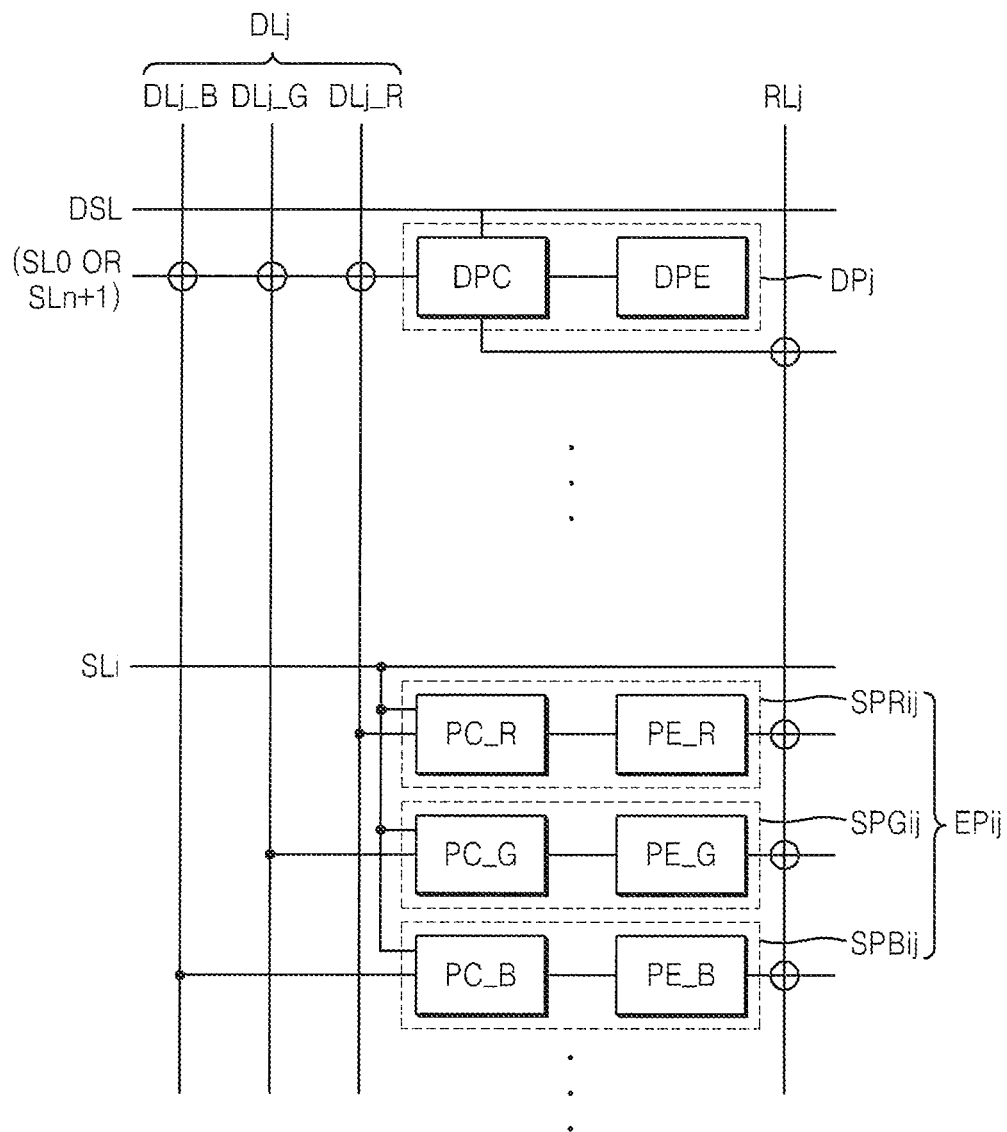
FIGS. 5 and 6 are diagrams illustrating a method of repairing a defective pixel by using a repair line, according to embodiments of the present invention.
Figure 6:
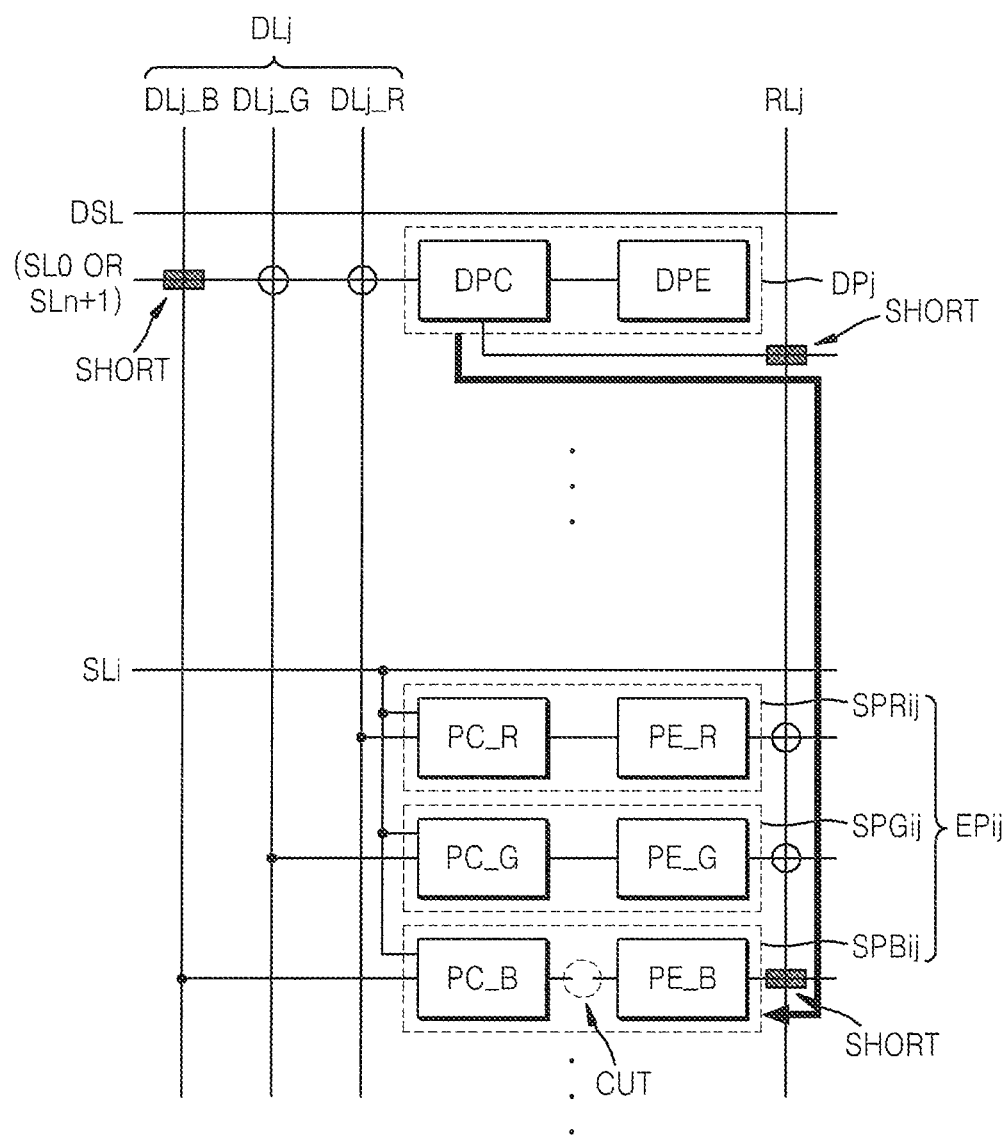

FIGS. 5 and 6 are diagrams illustrating a method of repairing a defective pixel by using a repair line RLj, according to embodiments of the present invention.

Referring to FIG. 5, an emission pixel EPij is coupled to a scan line SLi of an ith pixel row and a data line DLj of a jth pixel column. The emission pixel EPij may include a plurality of sub emission pixels. Each of the sub emission pixels may emit a single color, for example, one of red, blue, green, and white. However, the present invention is not limited thereto. In other embodiments, the sub emission pixels may emit colors other than red, blue, green, and white.

In FIG. 5, the emission pixel EPij includes a red sub emission pixel SPRij, a green sub emission pixel SPGij, and a blue sub emission pixel SPBij. The sub emission pixels SPRij, SPGij, and SPBij included in the emission pixel EPij may be coupled to the scan line SLi of the ith pixel row, receive a same scan signal Si, and receive separate data signals from data lines DLj_R, DLj_G, and DLj_B, respectively, of the jth pixel column.

Driving units PC_R, PC_G, and PC_B of the sub emission pixels SPRij, SPGij, and SPBij, respectively, are enabled according to the scan signal Si supplied from the scan line SLi. Driving currents generated by each of the driving units PC_R, PC_G, and PC_B in correspondence with the data signals are supplied to emission devices PE_R, PE_G, and PE_B, respectively, to cause the emission devices PE_R, PE_G, and PE_B to emit light of corresponding brightness and display an image.

A spare pixel circuit DPj is coupled to the repair scan line DSL and is normally insulated from (e.g., not electrically connected to) the data line DLj of the jth pixel column. The repair scan line DSL may be, for example, the repair scan line SL0 of a $0^{th}$ pixel row or the repair scan line SLn+1 of an (n+1)th pixel row. The spare pixel circuit DPj includes a spare driving unit DPC and a dummy emission device DPE. The dummy emission device DPE may not actually emit light but may function as a circuit device. For example, the dummy emission device DPE may function as a capacitor. The spare pixel circuit DPj may include a plurality of driving transistors corresponding to the sub emission pixels SPRij, SPGij, and SPBij included in the emission pixel EPij.

Referring to FIG. 6, one of the sub emission pixels SPRij, SPGij, and SPBij included in the emission pixel EPij may be coupled to the spare pixel circuit DPj through the repair line RLj. For example, when the blue sub emission pixel SPBij is a defective pixel due to a defect of the driving unit PC_B, the driving unit PC_B of the blue sub emission pixel SPBij and the emission device PE_B are, for example, cut (or otherwise electrically disconnected) from each other using semiconductor fabrication techniques as known in the art. In addition, the emission device PE_B is coupled (e.g., electrically connected) to the repair line RLj using semiconductor fabrication techniques as known in the art, such as using a laser to short circuit the emission device PE_B to the repair line RLj.

In a similar fashion, the spare driving unit DPC of the spare pixel circuit DPj is coupled (e.g., electrically connected) to the blue data line DLj_B and the repair line RLj by using semiconductor fabrication techniques as known in the art, such as using a laser to short circuit the spare driving unit DPC to the blue data line DLj_B and the repair line RLj. In some embodiments, the repair line RLj may need to be cut from a first power source (such as a first power voltage ELVDD) using semiconductor fabrication techniques as known in the art. When the above repair process is completed, the spare driving unit DPC is configured to operate like the driving unit PC_B corresponding to the blue sub emission pixel SPBij is intended to operate.

Accordingly, a driving current according to a data signal corresponding to the blue sub emission pixel SPBij that is defective is supplied to the emission device PE_B of the blue sub emission pixel SPBij from the spare driving unit DPC of the spare pixel circuit DPj through the repair line RLj. Thus, the blue sub emission pixel SPBij that is defective is repaired as if it were a normal pixel and emits light with a normal brightness.

Figure 7:
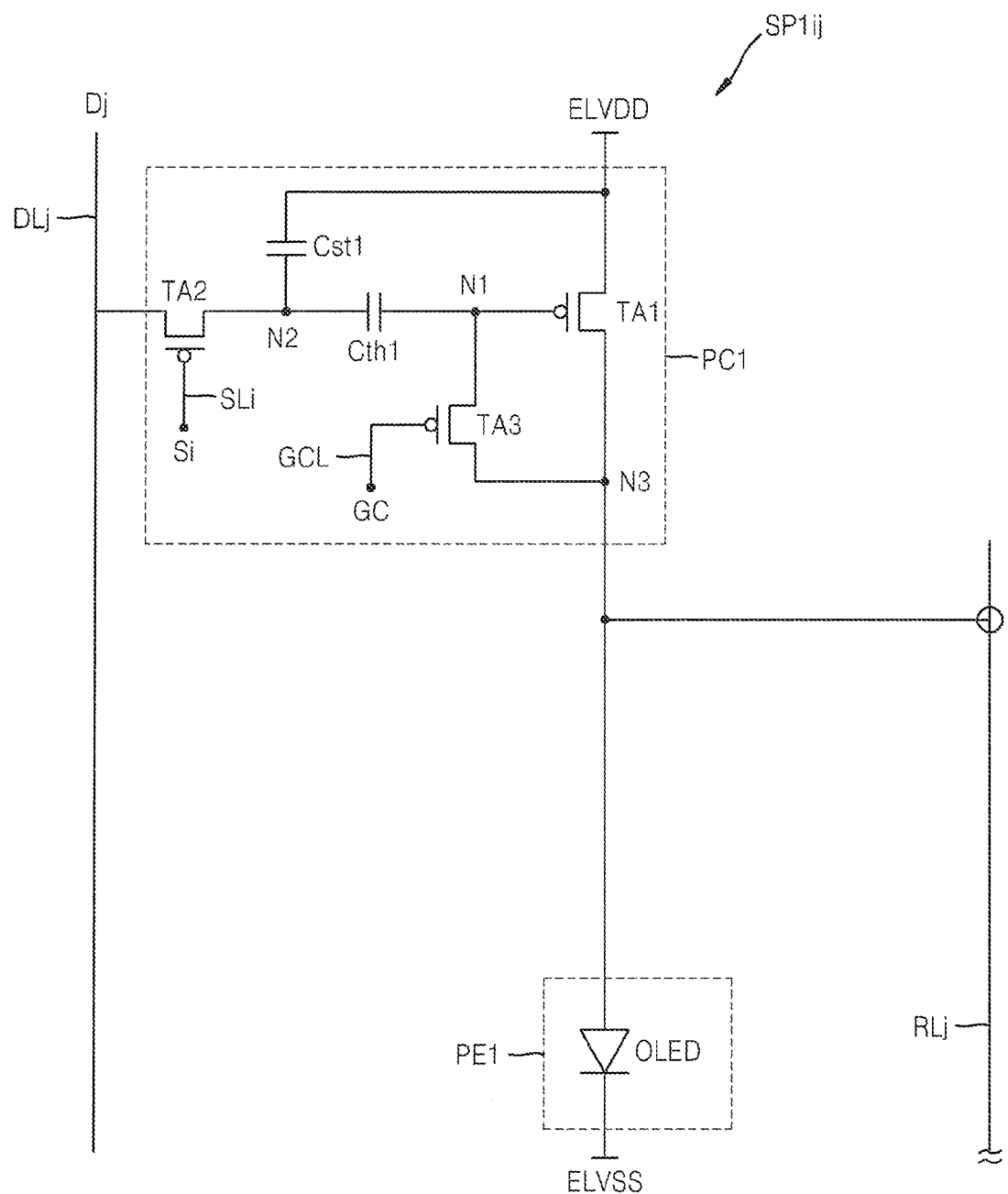
FIG. 7 is a circuit diagram of a sub emission pixel according to an embodiment of the present invention.

FIG. 7 is a circuit diagram of a sub emission pixel SP1ij according to an embodiment of the present invention.

The sub emission pixel SP1ij of FIG. 7 is one of a plurality of sub emission pixels included in the emission pixel EPij that is coupled to the scan line SLi of an ith pixel row and the data line DLj of a jth pixel column (as illustrated, for example, in FIG. 5). The sub emission pixel SP1ij may be, for example, the red sub emission pixel SPRij, the green sub emission pixel SPGij, or the blue sub emission pixel SPBij. The data line DLj (supplying the data signal Dj) may be a red data line DLj_R that supplies a red data signal Dj_R, a green data line DLj_G that supplies a green data signal Dj_G, or a blue data line DLj_B that supplies a blue data signal Dj_B according to the type of sub emission pixel SP1ij.

The sub emission pixel SP1ij includes a driving unit PC1 and an emission device PE1. The emission device PE1 is normally insulated (e.g., electrically disconnected) from the repair line RLj. When the emission device PE1 is repaired later, the emission device PE1 may be, for example, cut (e.g., electrically disconnected) from the driving unit PC1 and coupled to the repair line RLj using semiconductor fabrication techniques as known in the art, such as using a laser to short circuit the emission device PE1 to the repair line RLj.

The driving unit PC1 includes a driving transistor TA1, a switching transistor TA2, a compensation transistor TA3, a storage capacitor Cst1, and a compensation capacitor Cth1. The driving transistor TA1 includes a gate electrode coupled to a first node N1, a first electrode coupled to a first power voltage ELVDD (or a power source for providing the first power voltage ELVDD), and a second electrode coupled to a third node N3. The driving transistor TA1 generates a driving current corresponding to a data signal Dj supplied to a second node N2 (which in turn adjusts a voltage corresponding to the data signal Dj at the first node N1 via the compensation capacitor Cth1) and supplies the driving current to an organic light-emitting diode (OLED) of the emission device PE1.

The switching transistor TA2 includes a gate electrode coupled to the scan line SLi, a first electrode coupled to the data line DLi, and a second electrode coupled to the second node N2. The switching transistor TA2 is turned on by the scan signal Si of a gate-on level that is supplied through the scan line SLi and transfers a data voltage according to the data signal Dj supplied through the data line DLj to the second node N2.

The compensation transistor TA3 includes a gate electrode coupled to a first control line GCL, a first electrode coupled to the first node N1, and a second electrode coupled to the third node N3. The compensation transistor TA3 is turned on by a first control signal GC of a gate-on level that is supplied through the first control line GCL and couples the gate electrode and the second electrode of the driving transistor TA1 (e.g., diode connects the driving transistor TA1). Thus, a threshold voltage variation of the driving transistor TA1 is removed and compensated for by eliminating a threshold voltage of the driving transistor TA1 from an arithmetic expression for obtaining a driving current corresponding to a data voltage applied to the gate electrode of the driving transistor TA1.

The storage capacitor Cst1 includes a first electrode (or terminal or end) coupled to the first power voltage ELVDD and a second electrode (or terminal or end) coupled to the second node N2. The storage capacitor Cst1 stores a voltage value as much as a difference of voltages applied to both ends thereof. Thus, a data voltage supplied to the second node N2 is maintained and stored.

The compensation capacitor Cth1 includes a first electrode coupled to the first node N1 and a second electrode coupled to the second node N2. The compensation capacitor Cth1 maintains a difference of voltages applied to both ends thereof. Consequently, a voltage value considering the threshold voltage of the driving transistor TA1 that is supplied to the first node N1 is maintained during a compensation period of the driving transistor TA1.

The OLED of the emission device PE1 includes an anode coupled to the driving unit PC1, a cathode coupled to a second power voltage ELVSS (or a power source for providing the second power voltage ELVSS), and an emission layer between the anode and the cathode. The OLED emits light with a brightness value corresponding to the driving current supplied through the driving transistor TA1 to display an image.

Figure 8:
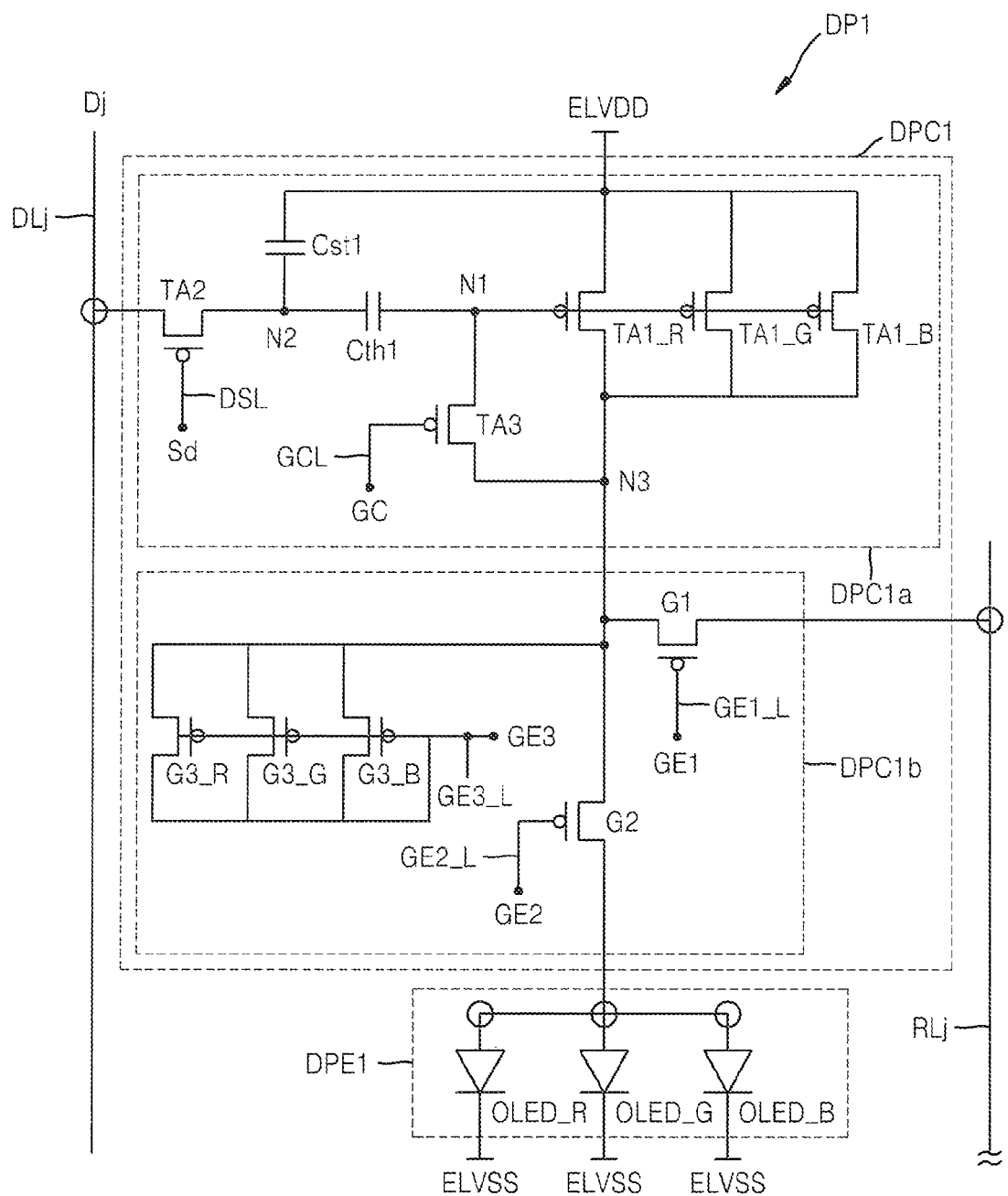
FIG. 8 is a circuit diagram of a spare pixel circuit corresponding to the sub emission pixel of FIG. 7, according to an embodiment of the present invention.

FIG. 8 is a circuit diagram of the spare pixel circuit DP1 corresponding to the sub emission pixel SP1ij of FIG. 7, according to an embodiment of the present invention.

The spare pixel circuit DP1 includes a spare driving unit DPC1 and a dummy emission device DPE1. The spare driving unit DPC1 is coupled to the repair line RLj (by using, for example, a laser short) when a defective pixel is detected in the display area AA and is electrically connected to an emission device of the defective pixel. The spare driving unit DPC1 may include a first driving unit, such as an emission driving unit DPC1a, and a second driving unit, such as a repair driving unit DPC1b.

The emission driving unit DPC1a is a similar circuit unit to the driving unit PC1 of sub emission pixel SP1ij and enables the spare pixel circuit DP1 to perform a similar function to the driving unit PC1, such as generating a driving current corresponding to a data signal Dj. The repair driving unit DPC1b is a circuit unit that supplies the driving current generated by the emission driving unit DPC1a to the emission device of the defective pixel when the defective pixel is detected in the display area AA and the spare pixel circuit DP1 is coupled to the repair line RLj by using, for example, a laser short.

Referring to FIG. 8, the emission driving unit DPC1a includes the driving transistor TA1 (represented by first through third driving transistors TA1_R, TA1_G, TA1_B), the switching transistor TA2, the compensation transistor TA3, the storage capacitor Cst1, and the compensation capacitor Cth1. The emission driving unit DPC1a of FIG. 8 is similar to or the same as the driving unit PC1 of the sub emission pixel SP1ij except for the driving transistor TA1. Accordingly, differences between the two circuits will now be described below.

The driving transistor TA1 of the spare pixel circuit DP1 includes the first through third driving transistors TA1_R, TA1_G, TA1_B that are coupled in parallel to each other. The driving transistor TA1 may include the first driving transistor TA1_R corresponding to a red sub emission pixel, the second driving transistor TA1_G corresponding to a green sub emission pixel, and a third driving transistor TA1_B corresponding to a blue sub emission pixel. When an emission pixel includes four sub emission pixels R, G, B, and W, the driving transistor TA1 may further include a fourth driving transistor TA1_W coupled in parallel to the first through third driving transistors TA1_R, TA1_G, TA1_B and corresponding to a white sub emission pixel.

Each of the first through third driving transistors TA1_R, TA1_G, TA1_B includes a gate electrode coupled to the first node N1, a first electrode coupled to the first power voltage ELVDD, and a second electrode coupled to the third node N3. Each of the first through third driving transistors TA1_R, TA1_G, TA1_B generates a driving current corresponding to the data signal Dj supplied to the second node N2 (which in turn supplies a voltage corresponding to the data signal Dj to the first node N1).

When an emission pixel includes a plurality of sub emission pixels, and a spare pixel circuit includes a corresponding plurality of sub spare pixel circuits (as opposed to the corresponding plurality of driving transistors discussed above), unused space (e.g., dead space) increases as the repair area DA increases. Accordingly, embodiments of the present invention provide for a plurality of circuit devices having different characteristics for each sub emission pixel in a single spare pixel circuit (for example, the plurality of driving transistors that supply corresponding driving currents to the corresponding plurality of sub emission pixels as discussed above), and provide for a single circuit device (e.g., one or more common circuit devices) having the same characteristics for each sub emission pixel.

Therefore, the single spare pixel circuit may have characteristics of the plurality of sub emission pixels sufficient to be used for a repair of any one of the sub emission pixels and without having to recreate all of the circuit devices for each of the sub emission pixels. This may lead to a reduction in space used by the repair area DA.

The switching transistor TA2 includes a gate electrode coupled to the repair scan line DSL, a first electrode normally insulated from the data line DLj, and a second electrode coupled to the second node N2. When the switching transistor TA2 is coupled to the data line DLj, the switching transistor TA2 is turned on by a scan signal Sd supplied by the repair scan line DSL to transfer the data signal Dj (supplied through the data line DLj) to the second node N2. In this regard, the data line DLj includes the plurality of data lines DLj_R, DLj_G, and DLj_B to which the plurality of data signals Dj_R, Dj_G, and Dj_B are respectively supplied.

The repair driving unit DPC1b includes a first repair transistor G1, a second repair transistor G2, and a plurality of third repair transistors G3 (represented by red, green, blue third repair transistors G3_R, G3_G, G3_B).

The first repair transistor G1 includes a gate electrode coupled to a first repair control line GE1_L, a first electrode coupled to the third node N3, and a second electrode normally insulated from the repair line RLj. The first repair transistor G1 is turned on in response to a first repair control signal GE1 supplied through the first repair control line GE1_L. Then the driving current supplied from one of the first through third driving transistors TA1_R, TA1_G, TA1_B is transferred to the repair line RLj (after the second electrode of the first repair transistor G1 is coupled to the repair line RLj). The first repair transistor G1 is turned on only during an emission period of the display area AA. In this regard, the driving current is supplied to the repair line RLj so that the emission device PE of a defective sub emission pixel SP1ij of the display area AA emits light.

The second repair transistor G2 includes a gate electrode coupled to a second repair control line GE2_L, a first electrode coupled to the third node N3, and a second electrode normally insulated from an anode of the dummy emission device DPE1. The second repair transistor G2 is turned on in response to a second repair control signal GE2 supplied through the second repair control line GE2_L.

Then, after the second electrode of the second repair transistor G2 is coupled to an appropriate anode of the dummy emission device DPE1, the second repair transistor G2 is initialized (or reset) by using an OLED that is present in the dummy emission device DPE1 coupled to the second electrode, and compensates for a threshold voltage of the driving transistor TA1 in the same or similar way as the sub emission pixel SP1ij. The second repair transistor G2 remains turned off during the emission period of the display area AA.

The third transistors G3 include a plurality of third transistors G3_R, G3_G, and G3_B that are coupled in parallel to each other. The plurality of third transistors G3 may include a red third repair transistor G3_R corresponding to the red sub emission pixel, a green third repair transistor G3_G corresponding to the green sub emission pixel, and a blue third repair transistor G3_B corresponding to the blue sub emission pixel. Each of the third repair transistors G3_R, G3_G, and G3_B includes a gate electrode and a second electrode that are coupled to a third repair control line GE3_L and a first electrode coupled to the third node N3.

That is, each of the third repair transistors G3_R, G3_G, and G3_B has a diode connection structure to have the same or similar characteristics as that of an OLED corresponding to the same color of sub emission pixel. In other words, since sub emission pixels have different OLED characteristics, the plurality of third repair transistors G3 have the OLED characteristics respectively corresponding to the different sub emission pixels.

Each of the third repair transistors G3_R, G3_G, and G3_B is turned on in response to a third repair control signal GE3 supplied through the third repair control signal line GE3_L. Then, a driving current of the third node N3 flows in the same way as the corresponding OLED characteristics through one of the third repair transistors G3_R, G3_G, and G3_B that is turned on. Accordingly, a voltage of an OLED of a previous frame that is supplied to the repair line RL1 may be initialized as a voltage of an OLED that currently emits light. For such an initialization, the third repair control signal GE3 is supplied at a gate on voltage level concurrently (e.g., simultaneously)

with the first repair transistor G1, e.g., during a set or predetermined initial period of an emission period (such as a pre-emission period).

The dummy emission device DPE1 may include a plurality of first through third OLEDs OLED_R, OLED_G, and OLED_B each including an anode in addition to a cathode coupled to the second power voltage ELVSS. The dummy emission device DPE1 may be the first OLED OLED_R corresponding to the red sub emission pixel, the second OLED OLED_G corresponding to the green sub emission pixel, and the third OLED OLED_B corresponding to the blue sub emission pixel. The anode of each of the first through third OLEDs OLED_R, OLED_G, and OLED_B is normally insulated from the repair driving unit DPC1b. The first through third OLEDs OLED_R, OLED_G, and OLED_B do not emit light and instead function as capacitors.

Figure 9:
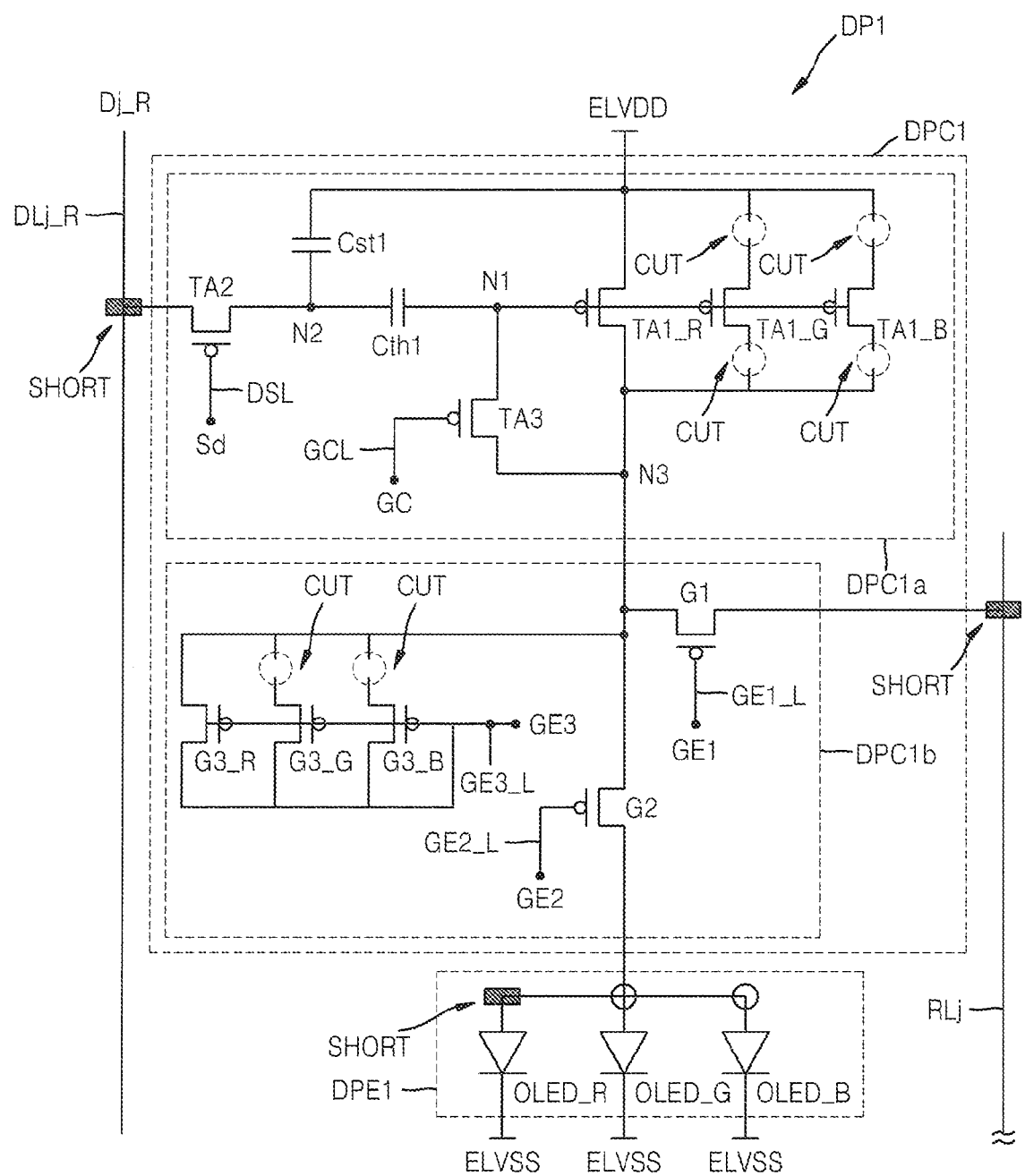
FIG. 9 is a circuit diagram illustrating a method of coupling the spare pixel circuit of FIG. 8 to a repair line, according to an embodiment of the present invention.

FIG. 9 is a circuit diagram illustrating a method of coupling the spare pixel circuit DP1 of FIG. 8 to the repair line RLj.

FIG. 9 shows a method of repairing the red sub emission pixel SPRij by using the spare pixel circuit DP1 when the red sub emission pixel SPRij included in the emission pixel EPij that is coupled to an ith scan line SLi and the jth data line DLj is defective. Referring momentarily to FIG. 5, the driving unit PC_R and the emission device PE_R of the defective red sub emission pixel SPRij are separated (e.g., electrically separated, such as by being cut, electrically disconnected, or otherwise rendered inoperable or disabled) from each other, and the emission device PE_R is coupled (e.g., electrically connected) to the repair line RLj by using, for example, a laser short.

Referring back to FIG. 9, the emission driving unit DPC1a of the spare pixel circuit DP1 couples (e.g., electrically connects) a first electrode of the switching transistor TA2 to the red data line DLj_R that supplies the red data signal Dj_R by using, for example, a laser short. The second driving transistor TA1_G and the third driving transistor TA1_B are separated (e.g., electrically separated or otherwise isolated or bypassed) from the emission driving unit DPC1a (e.g., disconnected from any active current paths) leaving the first driving transistor TA1_R (corresponding to a red sub emission pixel) still functioning. In this regard, at least one of first and second electrodes of the second driving transistor TA1_G and the third driving transistor TA1_B may be cut.

Likewise, the green third repair transistor G3_G and the blue third repair transistor G3_B are separated (e.g., electrically disconnected) from the repair driving unit DPC1b by, for example, being cut, leaving the red third repair transistor G3_R still functioning. In this regard, first electrodes of the green third repair transistor G3_G and the blue third repair transistor G3_B may be cut. A second electrode of the first repair transistor G1 is coupled to the repair line RLj by using, for example, a laser short. An anode of the first OLED OLED_R of the dummy emission device DPE1 is coupled to the repair driving unit DPC1b by using, for example, a laser short.

The spare pixel circuit DP1 and the red sub emission pixel SPRij are coupled to the repair line RLj as described above. Therefore, a driving current generated by the spare driving unit DPC1 of the spare pixel circuit DP1 is supplied to the emission device PE_R of the red sub emission pixel SPRij through the repair line RLj to cause the red sub emission pixel SPRij to emit light. Then, even though an emission pixel EPij is defective, an OLED of the defective pixel emits light through the spare pixel circuit DP1, thereby improving the display quality and preventing pixel defects from deteriorating the display area AA.

Figure 10:
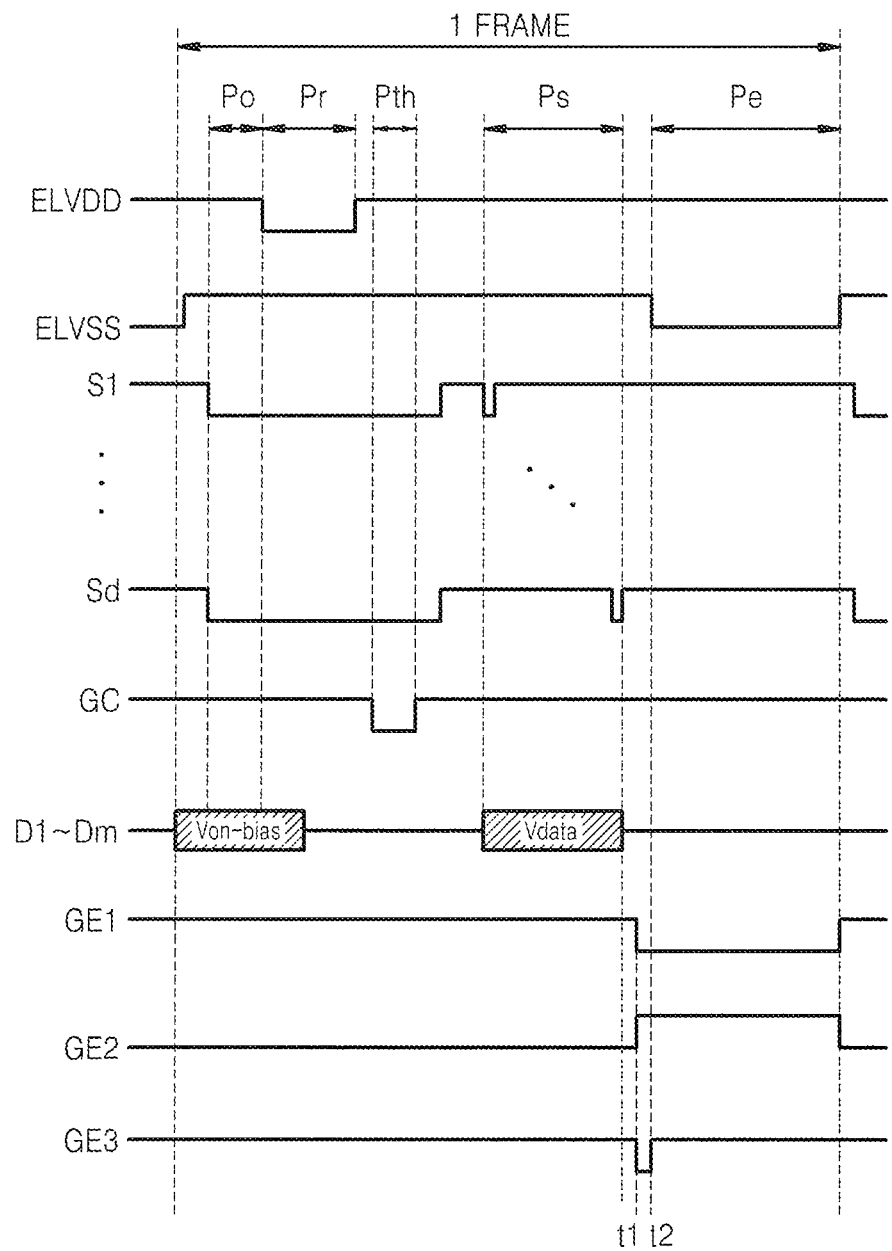
FIG. 10 is a timing diagram illustrating a method of driving the sub emission pixel of FIG. 7 and the spare pixel circuit of FIG. 8, according to an embodiment of the present invention.

FIG. 10 is a timing diagram illustrating a method of driving the sub emission pixel SP1ij of FIG. 7 and the spare pixel circuit DP1 of FIG. 8, according to an embodiment of the present invention.

Driving transistors of the sub emission pixel SP1ij and the spare pixel circuit DP1 shown in FIGS. 7 and 8 are PMOS transistors. Accordingly, a low voltage level is used to turn on these transistors. For ease of description, in FIG. 10, the repair scan line DSL of the repair area DA is the (n+1)th scan line SLn+1 after the last (nth) scan line SLn of the display area AA. In other embodiments, the corresponding timing diagram may be different to account for the different embodiments, such as using other types of transistors (e.g., NMOS transistors) for the driving transistors or other locations for the repair scan lines DSL or repair area DA (such as before the first scan line SL1, or to the left or right of the display area AA).

A case where the spare pixel circuit DP1 operates by being coupled to one of the first through third driving transistors TA1_R, TA1_G, and TA1_B, a corresponding one of the third repair transistors G3_R, G3_G, and G3_B, and a corresponding one of the first through third OLEDs OLED_R, OLED_G, and OLED_B to drive a defective sub emission pixel will now be described. Referring to FIG. 10, a frame period 1 Frame in which a single image is displayed on the display area AA includes an on-bias period Po for improving a response waveform, a reset period Pr for resetting driving voltages of OLEDs, a compensation period Pth for compensating threshold voltages of driving transistors, a scan period Ps for supplying data signals, and an emission period Pe for causing the pixels to concurrently (e.g., simultaneously) emit light corresponding to the data signals.

During the on-bias period Po, the first power voltage ELVDD and the second power voltage ELVSS are supplied as high level voltages. A plurality of scan signals S1 through Sn and Sd are supplied to the sub emission pixels SP1ij and the spare pixel circuits DP1 as low level voltages. In this regard, the scan signals S1 through Sn are supplied to the sub emission pixels SP1ij of the display area AA, and the scan signal Sd is supplied to the spare pixel circuits DP1 of the repair area DA.

During the on-bias period Po, the first control signal GC is supplied at a high level voltage, and a plurality of data signals D1 through Dm are supplied at a set or predetermined on-bias voltage Von-bias. During this period, the first repair control signal GE1 and the third repair control signal GE3 are supplied to the spare pixel circuits DP1 as high level voltages, and the second repair control signal GE2 is supplied at a low level voltage.

During the on-bias period Po, the on-bias voltage Von-bias is supplied to the second node N2 (and a voltage corresponding to the on-bias voltage supplied to the first node N1) of each of the sub emission pixels SP1ij and the spare pixel circuits DP1 used for repairing through the data lines DL1 through DLm in correspondence to the scan signals S1 through Sn and Sd. That is, a voltage corresponding to the on-bias voltage Von-bias is applied to a gate electrode of the driving transistor TA1 of the sub emission pixels SP1ij and the spare pixel circuits DP1. Accordingly, gate electrode voltages of the driving transistors TA1 of all the pixels are supplied with a specific voltage (the voltage corresponding to the on-bias voltage Von-bias). Consequently, response waveforms of the pixels may be improved. According to an embodiment, the on-bias period Po may be skipped.

During the reset period Pr, the first power voltage ELVDD is supplied at a low level voltage while the second power voltage ELVSS is still supplied at a high level voltage. Thus, although current does not flow from the driving transistors TA1 of the sub emission pixels SP1ij and the spare pixel circuits DP1 to the OLEDs, voltages of the third nodes N3 become low level voltages of the first power voltage ELVDD through the driving transistors TA1 that are turned on. That is, for each pixel, a voltage of the third node N3 according to a data signal supplied from a previous frame is reset by the low level voltage of the first power voltage ELVDD. In each of the active spare pixel circuits DP1, only the second repair transistor G2 is turned on (by the second repair control signal GE2 supplied at a low level). Consequently, the third node N3 is reset by the first power voltage ELVDD of a low level.

During the compensation period Pth, when the scan signals S1 through Sn and Sd are supplied, the first power voltage ELVDD and the second power voltage ELVSS are each supplied at a high level voltage, while the first control signal GC is supplied at a gate on voltage that is a low level to each of the pixels. The compensation transistor TA3 is turned on by the first control signal GC in each of the sub emission pixels SP1ij and spare pixel circuits DP1. Since the compensation transistor TA3 is turned on, the driving transistor TA1 is diode-connected, and a threshold voltage of the driving transistor TA1 is supplied to the first node N1. Accordingly, a voltage value to which the threshold voltage of the driving transistor TA1 is applied is stored in the compensation capacitor Cth1.

The threshold voltage of the driving transistor TA1 is erased during a process of calculating a driving current amount according to an input data signal. Thus, a threshold voltage variation that is characteristic of the driving transistor TA1 may be removed in all the sub emission pixels SP1ij and spare pixel circuits DP1. That is, during the compensation period Pth, the threshold voltage of the driving transistor TA1 of each of the sub emission pixels SP1ij and spare pixel circuits DP1 is compensated for. Thus, a display apparatus may display an image with a uniform brightness irrespective of a threshold voltage variation according to the characteristics of the driving transistors.

The scan signals S1 through Sn and Sd concurrently (e.g., simultaneously) rise to a high level after the compensation period Pth ends. The first control signal GC also rises to a high level. During the scan period Ps, the scan signals S1 through Sn and Sd are sequentially supplied to each row of the sub emission pixels SP1ij and spare pixel circuits DP1.

Then, the switching transistors TA2 of the sub emission pixels SP1ij and spare pixel circuits DP1 are turned on, and data voltages Vdata according to the data signals D1 through Dm are supplied through the data lines DL coupled to first electrodes of the switching transistors TA2. The data voltages Vdata are respectively transferred to the second node N2 of each of the sub emission pixels SP1ij and spare pixel circuits DP1 and are stored in the corresponding storage capacitors Cst1. In this regard, data signals supplied to the spare pixel circuits DP1 are the same as data signals intended to be supplied to the corresponding defective sub emission pixels SP1ij.

During the on-bias period Po, the reset period Pr, the compensation period Pth, and the scan period Ps, the second power voltage ELVSS is supplied at a high level voltage. Consequently, the OLEDs of the sub emission pixels SP1ij and the spare pixel circuits DP1 do not emit light.

The first and third repair control signals GE1 and GE3 are supplied to the repair driving unit DPC1b of the spare pixel circuits DP1 at a high level voltage during the on-bias period Po, the reset period Pr, the compensation period Pth, and the scan period Ps, while the second repair control signal GE2 is supplied at a low level voltage during the on-bias period Po, the reset period Pr, the compensation period Pth, and the scan period Ps. Therefore, the first repair transistor G1 of the repair driving unit DPC1b of the spare pixel circuits DP1 remains turned off during a non-emission period (the on-bias period Po, the reset period Pr, the compensation period Pth, and the scan period Ps). Consequently, parasitic capacitance caused by, for example, using a laser short connection of the repair lines RL may be reduced or eliminated when the spare driving unit DPC1 is reset and a threshold voltage of the driving transistor TA1 is compensated for.

In addition, during the non-emission period, the third repair transistor G3 of the repair driving unit DPC1b also remains turned off, while the second repair transistor G2 of the repair driving unit DPC1b remains turned on. Consequently, initialization, resetting, and compensation of threshold voltages of the driving transistors TA1 of the spare pixel circuits DP1 are performed concurrently (e.g., simultaneously) with those of the sub emission pixels SP1ij by using the OLED in the dummy emission device DPE1.

Further, during this non-emission period, the second power voltage ELVSS coupled to cathodes of the OLEDs of the spare pixel circuits DP1 is supplied at a high level voltage. Thus, no current flows to the OLEDs.

In the emission period Pe, the first power voltage ELVDD is supplied at a high level voltage while the second power voltage ELVSS is supplied at a low level voltage. Consequently, a path through which current flows from the first power voltage ELVDD to the OLED is formed in each of the sub emission pixels SP1ij, and a driving current corresponding to the data voltage according to a data signal stored in the storage capacitor Cst1 flows during the emission period Pe. Accordingly, the OLED of each of the sub emission pixels SP1ij emits light at brightness (value) corresponding to the driving current. The emission period Pe is applied to all the sub emission pixels SP1ij in the display area AA concurrently (e.g., simultaneously). Thus, the sub emission pixels SP1ij concurrently (e.g., simultaneously) emit light at corresponding brightness values to display images.

In addition, during the emission period Pe, the second and third repair control signals GE2 and GE3 are supplied to the repair driving unit DPC1b of the spare pixel circuits DP1 as high level voltages, while the first repair control signal GE1 is supplied at a low level voltage. Thus, the second repair transistor G2 of the repair driving unit DPC1b of each of the spare pixel circuits DP1 remains turned off during the emission period Pe, thereby preventing the driving current from flowing to the OLED (or equivalent circuit) in the dummy emission device DPE1 and the spare pixel circuits DP1 from emitting (or simulating the emission of) light. Further, the third repair transistor G3 of the repair driving unit DPC1b of each of the spare pixel circuits DP1 remains turned off during the emission period Pe.

However, the third repair control signal GE3 is supplied at a low level voltage during a pre-emission period (between time t1 and t2) right before the emission period Pe, while the first and second repair control signals GE1 and GE2 are supplied at their emission period Pe levels. Thus, during the pre-emission period, the third repair transistor G3 is turned on with the first repair transistor G1 while the second repair transistor G2 is turned off in each of the spare pixel circuits DP1.

Accordingly, driving voltages of OLEDs of a previous frame stored in the repair lines RL are initialized as driving voltages of OLEDs that currently emit light. That is, in each active spare pixel circuit DP1, when the third repair transistor G3 is turned on, a current flowing through the driving transistor TA1 has the same characteristic as that of the corresponding OLED as simulated through the third repair transistor G3. Consequently, the repair lines RL may be initialized at the corresponding OLED voltages during the pre-emission period.

The first repair transistor G1 of the repair driving unit DPC1*b* of each of the spare pixel circuits DP1 is turned on during the emission period Pe. Thus, driving current is supplied to the emission devices PE of the repaired sub emission pixels SP1*ij*, e.g., the OLEDs, through the corresponding repair lines RL electrically connected (for example, by using laser shorts). Thus, the defective sub emission pixels SP1*ij* may also emit light, which reduces or prevents brightness uniformity of the display area AA from deteriorating.

Figure 11:
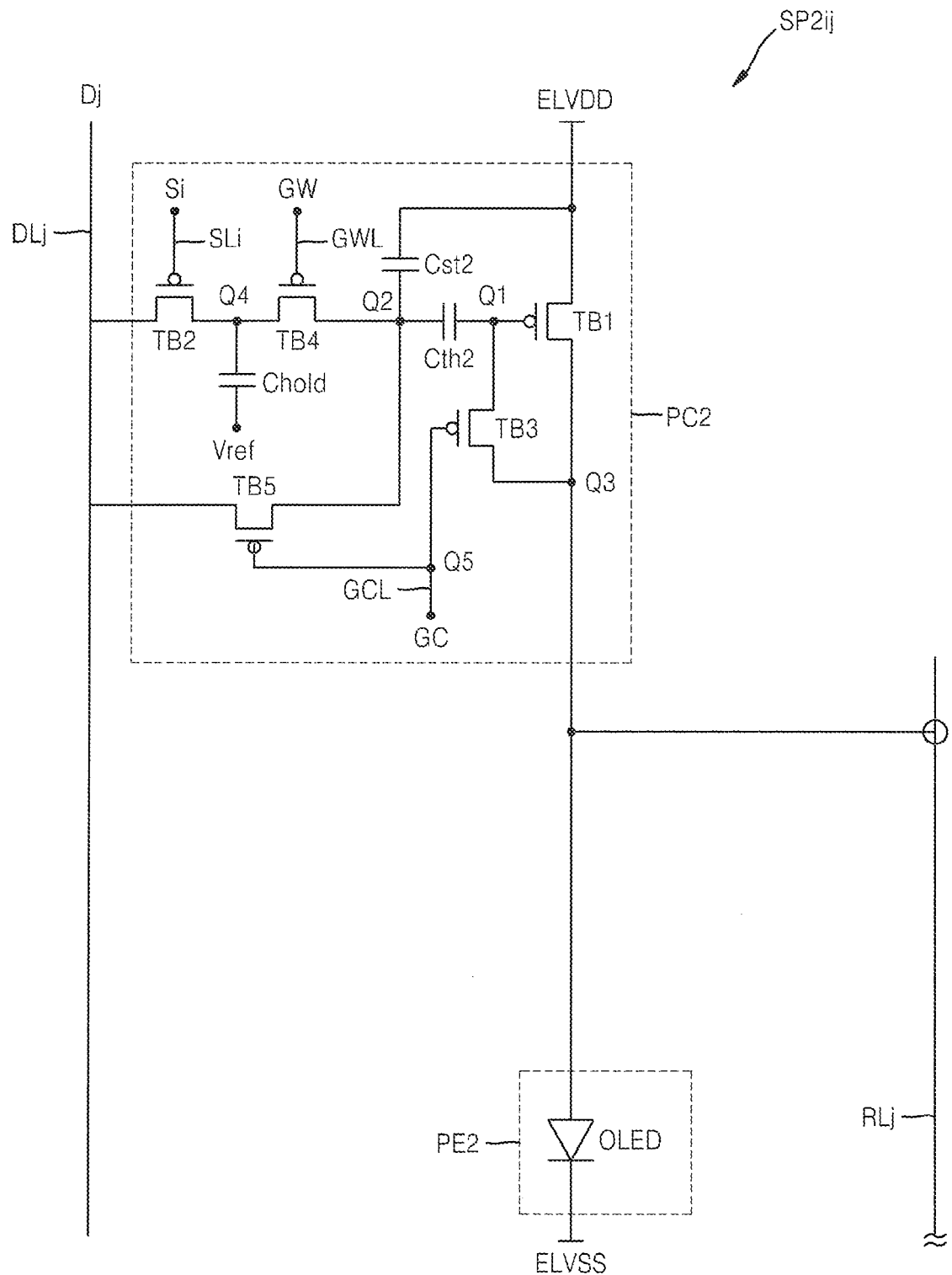
FIG. 11 is a circuit diagram of a sub emission pixel according to another embodiment of the present invention.

FIG. 11 is a circuit diagram of a sub emission pixel SP2*ij* according to another embodiment of the present invention.

The sub emission pixel SP2*ij* of FIG. 11 is included in the emission pixel EPij that is coupled to the scan line SLi of an ith pixel row and the data line DLj of a jth pixel column. The sub emission pixel SP2*ij* may be, for example, the red sub emission pixel SPRij, the green sub emission pixel SPGij, or the blue sub emission pixel SPBij. As such, the data line DLj (that supplies the data signal Dj) may be the corresponding red data line DLj_R that supplies the red data signal Dj_R, the green data line DLj_G that supplies the green data signal Dj_G, or the blue data line DLj_B that supplies the blue data signal Dj_B according to the sub emission pixel SP2*ij*.

The sub emission pixel SP2*ij* includes a driving unit PC2 and an emission device PE2. The emission device PE2 is normally insulated from the repair line RLj. When the sub emission pixel SP2*ij* is repaired, the emission device PE2 may be separated (e.g., electrically disconnected) from the driving unit PC2 by semiconductor fabrication techniques known to one of ordinary skill, such as by being cut, and coupled to the repair line RLj by using, for example, a laser short.

The driving unit PC2 includes a driving transistor TB1, a switching transistor TB2, a compensation transistor TB3, a relay transistor TB4, a hold transistor TB5, a storage capacitor Cst2, a hold capacitor Chold, and a compensation capacitor Cth2. The driving transistor TB1 includes a gate electrode coupled to a first node Q1, a first electrode coupled to the first power voltage ELVDD, and a second electrode coupled to a third node Q3. The driving transistor TB1 generates a driving current corresponding to a data voltage (corresponding to the data signal Dj) supplied to the first node Q1, and supplies the driving current to an OLED of the emission device PE2.

The switching transistor TB2 includes a gate electrode coupled to the scan line SLi, a first electrode coupled to the data line DLj, and a second electrode coupled to a fourth node Q4. The switching transistor TB2 is turned on by the scan signal Si that is supplied through the scan line SLi, and transfers the data voltage according to the data signal Dj (supplied through the data line DLj) to the fourth node Q4.

A first electrode of the hold capacitor Chold is coupled to the fourth node Q4, and a second electrode thereof is coupled to a voltage supply line that supplies the reference voltage Vref. Thus, the hold capacitor Chold stores a voltage value of a difference between the data voltage supplied to the fourth node Q4 and the reference voltage Vref during a set or predetermined period, and maintains the data voltage according to the data signal Dj supplied through the data line DLj.

The relay transistor TB4 includes a gate electrode coupled to a second control line GWL, a first electrode coupled to the fourth node Q4, and a second electrode coupled to the second node Q2. The relay transistor TB4 is turned on by a second control signal GW supplied through the second control line GWL and transfers the data voltage (supplied to the fourth node Q4) to the second node Q2.

The second node Q2 is coupled to a second electrode of the storage capacitor Cst2, and the first power voltage ELVDD is coupled to a first electrode of the storage capacitor Cst2. Thus, the storage capacitor Cst2 stores a voltage value of a difference between a data voltage supplied to the second node Q2 and the first power voltage ELVDD during a set or predetermined period to maintain the data voltage for a set or predetermined period.

The compensation transistor TB3 includes a gate electrode coupled to the first control line GCL, a first electrode coupled to a first node Q1, and a second electrode coupled to a third node Q3. The compensation transistor TB3 is turned on by the first control signal GC that is supplied through the first control line GCL, and couples the gate electrode and the second electrode of the driving transistor TB1 (e.g., diode connects the driving transistor TB1). The compensation transistor TB3 removes and compensates for a threshold voltage variation of the driving transistor TB1.

The compensation capacitor Cth2 includes a first electrode coupled to the first node Q1 and a second electrode coupled to the second node Q2. The compensation capacitor Cth2 maintains a difference in voltages applied to both ends. Accordingly, a voltage value considering a threshold voltage of the driving transistor TB1 applied to the first node Q1 is maintained during a compensation period of the driving transistor TB1.

The hold transistor TB5 includes a gate electrode coupled to the first control line GCL, a first electrode coupled to the data line DLj, and a second electrode coupled to the second node Q2. The hold transistor TB5 is turned on concurrently (e.g., simultaneously) with the compensation transistor TB3 by the first control signal GC supplied through the first control line GCL, so that a voltage of the second node Q2 is maintained as a set or predetermined voltage supplied through the data line DLj.

Figure 12:
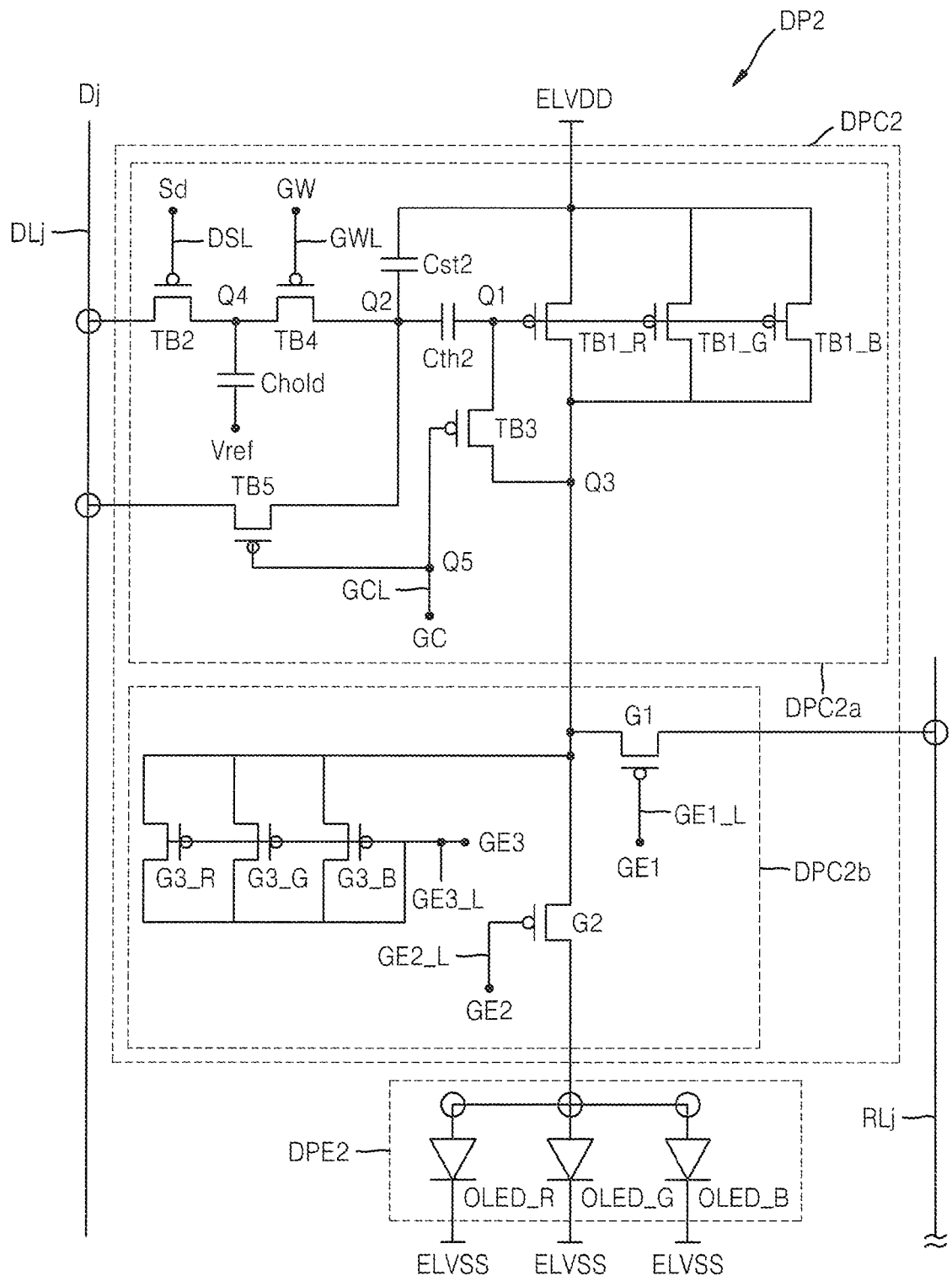
FIG. 12 is a circuit diagram of a spare pixel circuit corresponding to the sub emission pixel of FIG. 11, according to an embodiment of the present invention.

FIG. 12 is a circuit diagram of the spare pixel circuit DP2 corresponding to the sub emission pixel SP2*ij* of FIG. 11, according to an embodiment of the present invention.

The spare pixel circuit DP2 includes a spare driving unit DPC2 and a dummy emission device DPE2. The spare driving unit DPC2 is coupled to the repair line RLj by using, for example, a laser short when a defective pixel is detected in the display area AA and is electrically connected to an emission device of the defective pixel. The spare driving unit DPC2 may include a first driving unit, such as an emission driving unit DPC2*a*, and a second driving unit, such as a repair driving unit DPC2*b*.

The emission driving unit DPC2*a* is a circuit unit that enables the spare pixel circuit DP2 to function in place of a defective driving unit and generates a driving current corresponding to a data signal. The repair driving unit DPC2*b* is a circuit unit that is coupled to the repair line RLj by using, for example, a laser short when the defective pixel is detected in the display area AA, and supplies the driving current generated by the emission driving unit DPC2*a* to the emission device of the defective pixel.

The repair driving unit DPC2*b* and the dummy emission device DPE2 of the spare pixel circuit DP2 of FIG. 12 have the same (or substantially similar) structures as those of FIG. 8. Accordingly, descriptions thereof are not repeated here. The emission driving unit DPC2*a* of FIG. 12 is substantially the same as the driving unit PC2 of the sub emission pixel SP2*ij* of FIG. 11 except for a driving transistor TB1. Differences will now be described.

Referring to FIG. 12, the emission driving unit DPC2*a* of the spare pixel circuit DP2 includes the driving transistor TB1 (represented as first through third driving transistors TB1_R, TB1_G, TB1_B), the switching transistor TB2, the compensation transistor TB3, the relay transistor TB4, the hold transistor TB5, the storage capacitor Cst2, the hold capacitor Chold, and the compensation capacitor Cth2. The driving transistor TB1 of the spare pixel circuit DP2 includes a plurality of first through third driving transistors TB1_R, TB1_G, TB1_B that are coupled in parallel to each other. The driving transistor TB1 may include the first driving transistor TB1_R corresponding to a red sub emission pixel, the second driving transistor TB1_G corresponding to a green sub emission pixel, and a third driving transistor TB1_B corresponding to a blue sub mission pixel.

Each of the first through third driving transistors TB1_R, TB1_G, TB1_B includes a gate electrode coupled to the first node Q1, a first electrode coupled to the first power voltage ELVDD, and a second electrode coupled to the third node Q3. Each of the first through third driving transistors TB1_R, TB1_G, TB1_B generates a driving current corresponding to a data voltage (corresponding to the data signal Dj) supplied to the first node Q1.

The switching transistor TB2 includes a gate electrode coupled to the repair scan line DSL, a first electrode normally insulated from the data line DLj, and a second electrode coupled to the fourth node Q4. When the switching transistor TB2 is coupled to the data line DLj, the switching transistor TB2 is turned on by the scan signal Sd supplied to the repair scan line DSL to transfer the data signal Dj supplied through the data line DLj to the fourth node Q4. In this regard, the data line DLj includes the plurality of data lines DLj_R, DLj_G, and DLj_B to which the plurality of data signals Dj_R, Dj_G, and Dj_B are respectively supplied.

The hold transistor TB5 includes a gate electrode coupled to the first control line GCL, a first electrode normally insulated from the data line DLj, and a second electrode coupled to the second node Q2. When the hold transistor TB5 is coupled to the data line DLj, the hold transistor TB5 is turned on concurrently (e.g., simultaneously) with the compensation transistor TB3 by the first control signal GC supplied through the first control line GCL to maintain a voltage of the second node Q2 as a set or predetermined voltage supplied through the data line DLj.

Figure 13:
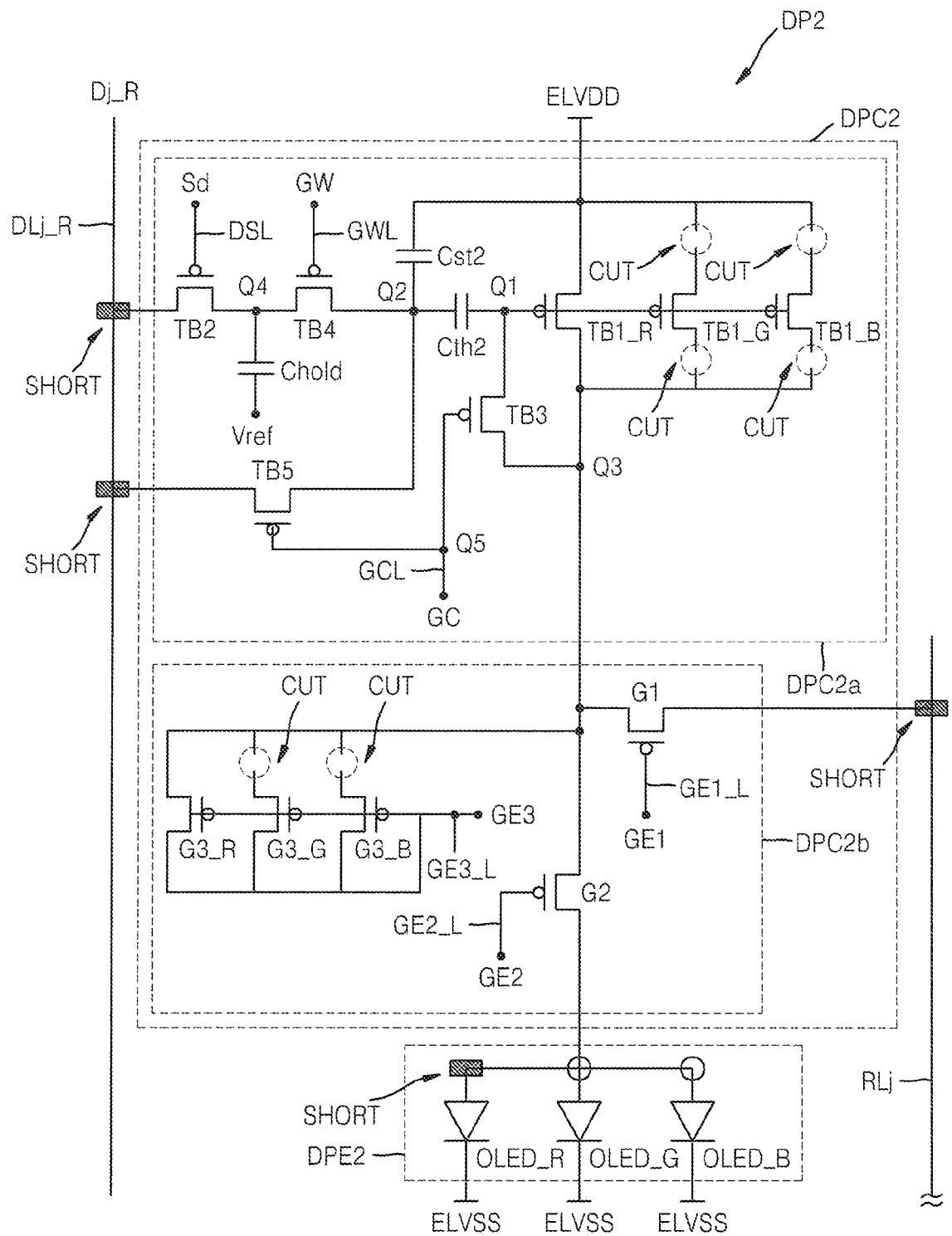
FIG. 13 is a circuit diagram illustrating a method of coupling the spare pixel circuit of FIG. 12 to a repair line, according to an embodiment of the present invention.

FIG. 13 is a circuit diagram illustrating a method of coupling the spare pixel circuit DP2 of FIG. 12 to the repair line RLj, according to an embodiment of the present invention.

FIG. 13 shows the method of repairing the red sub emission pixel SPRij by using the spare pixel circuit DP2 when the red sub emission pixel SPRij included in the emission pixel EPij (that is coupled to the ith scan line SLi and the jth red data line DLj_R) is defective. The driving unit PC_R and the emission device PE_R (see, for example, FIG. 5) of the defective red sub emission pixel SPRij are separated (e.g., electrically disconnected) by, for example, being cut from each other, and the emission device PE_R is coupled to the repair line RLj by using, for example, a laser short.

In the emission driving unit DPC2a of the spare pixel circuit DP2, a first electrode of the switching transistor TB2 and a first electrode of the hold transistor TB5 are coupled to the red data line DLj_R that supplies the red data signal Dj_R by using, for example, a laser short. The second driving transistor TB1_G and the third driving transistor TB1_B are separated (e.g., electrically disconnected) from the emission driving unit DPC2a by, for example, being cut, leaving the first driving transistor TB1_R corresponding to a red sub emission pixel still functioning. In this regard, at least one of first and second electrodes of the second driving transistor TB1_G and the third driving transistor TB1_B may be cut.

In the repair driving unit DPC2b, the green third repair transistor G3_G and the blue third repair transistor G3_B are separated from the repair driving unit DPC2b by, for example, being cut, leaving the red third repair transistor G3_R still functioning. In this regard, first electrodes of the green third repair transistor G3_G and the blue third repair transistor G3_B may be cut. A second electrode of the first repair transistor G1 is coupled to the repair line RLj by using, for example, a laser short.

In the dummy emission device DPE2, an anode of the first OLED OLED_R is coupled to the repair driving unit DPC2b by using, for example, a laser short.

The spare pixel circuit DP2 and the red sub emission pixel SPRij are coupled to the repair line RLj as described above. Accordingly, a driving current generated by the spare driving unit DPC2 of the spare pixel circuit DP2 is supplied to the emission device PE_R of the red sub emission pixel SPRij through the repair line RLj to cause the red sub emission pixel SPRij to emit light. Then, even though a pixel is defective, an OLED of the defective pixel emits light normally, thereby reducing or preventing brightness deterioration of the display area AA.

Figure 14:
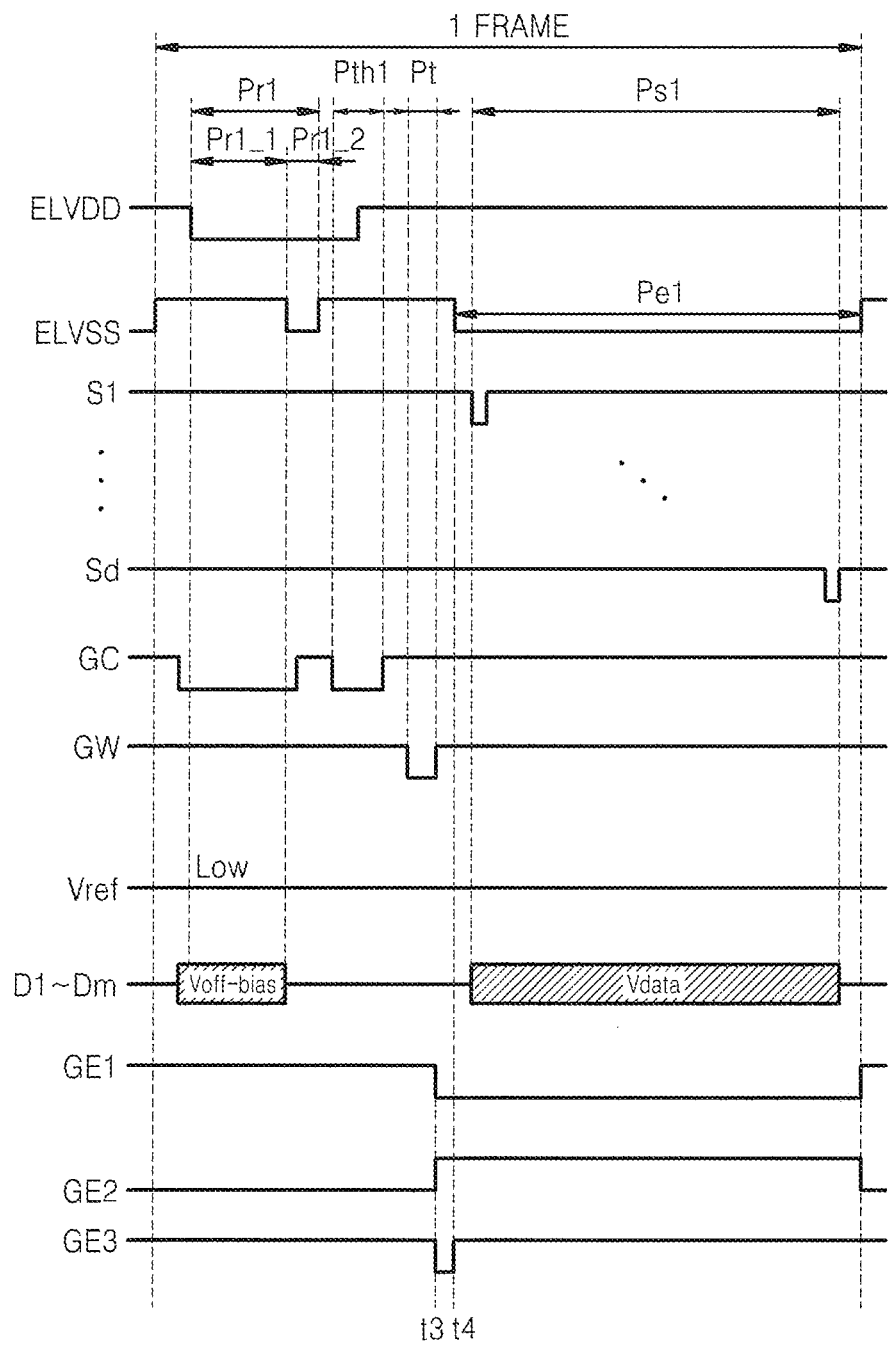
FIG. 14 is a timing diagram illustrating a method of driving the sub emission pixel of FIG. 11 and the spare pixel circuit of FIG. 12, according to an embodiment of the present invention.

FIG. 14 is a timing diagram illustrating a method of driving the sub emission pixel SP2ij of FIG. 11 and the spare pixel circuit DP2 of FIG. 12, according to an embodiment of the present invention. A case where the spare pixel circuit DP2 operates by being coupled to one of the first through third driving transistors TB1_R, TB1_G, and TB1_B, one of the third repair transistors G3_R, G3_G, and G3_B, and one of the first through third OLEDs OLED_R, OLED_G, and OLED_B in response to a repaired sub emission pixel will now be described.

Referring to FIG. 14, the frame period 1 Frame in which a single image is displayed on the display area AA includes a reset period Pr1 including a first reset period Pr1_1 and a second reset period Pr1_2, a compensation period Pth1 in which a threshold voltage of a driving transistor is compensated for, a transfer period Pt in which a data voltage (hereinafter referred to as a previous frame data voltage) according to a data signal supplied from a previous frame is transferred to the second node Q2 (to cause an appropriate data voltage at the first node Q1 for the driving transistor TB1 to drive the emission device PE2 to emit light), a scan period Ps1 in which a data voltage (hereinafter referred to as a current frame data voltage) corresponding to a current frame is supplied, and an emission period Pe1 in which a plurality of pixels concurrently (e.g., simultaneously) emit light in correspondence to the previous frame data voltages. In the driving method of FIG. 14, the emission period Pe1 is almost the same period as the scan period Ps1.

The driving method of FIG. 14 adjusts a power voltage level and performs each driving operation so that all pixels concurrently (e.g., simultaneously) emit light. Each pixel emits light in correspondence to a data signal of a previous frame and concurrently (e.g., simultaneously) writes (e.g., programs or stores) a data voltage according to the data signal of the current frame. That is, scanning and emitting are concurrently (e.g., simultaneously) performed in each pixel.

During the first reset period Pr1_1 included in the reset period Pr1, the first power voltage ELVDD is supplied at a low level voltage, the second power voltage ELVSS is supplied at a high level voltage, and the first control signal GC is supplied at a gate on voltage that is a low level. Accordingly, the compensation transistor TB3 and the hold transistor TB5 are turned on in the sub emission pixel SP2ij and the spare pixel circuit DP2 by the first control signal GC.

The compensation transistor TB3 is turned on so that a gate electrode and a second electrode of the driving transistor TB1 are coupled to each other (diode connected). The hold transistor TB5 is turned on so that a voltage supplied to the data line DLj is transferred (e.g., directly transferred) to the second node Q2. In this regard, a set or predetermined off-bias voltage Voff-bias is supplied to the data line DLj, and a voltage of the second node Q2 is reset by the off-bias voltage Voff.

Although a voltage value of the off-bias voltage Voff is not particularly limited, the voltage value may be a set or predetermined low level voltage. The off-bias voltage Voff is supplied to the second node Q2 during the first reset period Pr1_1 in all the sub emission pixels SP2$ij$ and the spare pixel circuits DP2. Consequently, a voltage value corresponding to a data voltage (and that caused the emission device PE2 to emit light in the previous frame) and that is stored in the storage capacitor Cst2 (that is coupled to the second node Q2) is then reset.

When the voltage of the second node Q2 is reset by the off-bias voltage Voff, a voltage of the first node Q1 varies with respect to a voltage variation of the second node Q2 due to coupling by the compensation capacitor Cth2. Then, the driving transistor TB1 may be turned on. Accordingly, current flows to the first power voltage ELVDD from the third node Q3 so that a voltage of the third node Q3 is lowered. That is, an anode voltage of the OLED is reset to a low level voltage.

Such a reset process may be possible in the spare pixel circuit DP2 since the second repair control signal GE2 is supplied at a low level voltage during the reset period Pr1 so that the second repair transistor G2 of the repair driving unit DPC2$b$ is turned on. Accordingly, a connection path may be formed from the third node Q3 to an anode of the first OLED OLED_R of the dummy emission device DPE2.

During the second reset period Pr1_2 included in the reset period Pr1, the first power voltage ELVDD is still supplied at a low level voltage, the second power voltage ELVSS is changed from a high level voltage to a low level voltage, and the first control signal GC is changed to and supplied as a gate off voltage that is a high level. Thus, the compensation transistor TB3 and the hold transistor TB5 are turned off according to a gate off voltage of the first control signal GC. The second power voltage ELVSS is changed to a low level voltage so that a voltage of the third node Q3 is reset as a lower voltage due to coupling by the OLED.

During the compensation period Pth1, the first power voltage ELVDD and the second power voltage ELVSS are supplied as high level voltages, while the first control signal GC is supplied at a gate on voltage that is a low level. Accordingly, the compensation transistor TB3 and the hold transistor TB5 are turned on by the first control signal GC.

A set or predetermined hold voltage may be supplied to the data line DLj of the sub emission pixels SP2$ij$ and the spare pixel circuits DP2. The hold voltage may be the same as or similar to the off-bias voltage Voff-bias. The hold transistor TB5 is turned on so that the hold voltage may be supplied to the second node Q2. The compensation transistor TB3 is turned on so that the driving transistor TB1 is diode-connected, and a threshold voltage of the driving transistor TB1 is supplied to the first node Q1. Accordingly, a voltage reflecting the threshold voltage of the driving transistor TB1 is stored in the compensation capacitor Cth2 so that the threshold voltage of the driving transistor TB1 is compensated for. Since the second power voltage ELVSS is supplied at a high level voltage, the OLED does not emit light.

During the transfer period Pt, the first power voltage ELVDD and the second power voltage ELVSS are each supplied at a high level voltage, while the second control signal GW is supplied at the gate on voltage that is a low level. The relay transistor TB4 is turned on by the second control signal GW. The relay transistor TB4 is turned on so that the fourth node Q4 and the second node Q2 are coupled to each other, and a voltage stored in the hold capacitor Chold is transferred to the second node Q2.

The data voltage supplied in the previous frame is stored in the hold capacitor Chold. Thus, the data voltage supplied in the previous frame is transferred to the second node Q2 during the transfer period Pt. Accordingly, a voltage of the first node Q1 varies in correspondence with (e.g., by as much as) the change in voltage of the second node Q2 to the data voltage due to coupling by the compensation capacitor Cth2. That is, the data voltage corresponding to the previous frame is reflected at the first node Q1 of the sub emission pixels SP2$ij$ and the spare pixel circuits DP2.

After the data voltage of the previous frame is transferred to the second node Q2, the second control signal GW rises at the end of the transfer period Pt to the gate off voltage that is a high level. Accordingly, the relay transistor TB4 turns off and the fourth node Q4 and the second node Q2 are disconnected from each other.

During the scan period Ps1, the scan signals S1 through Sn and Sd of the gate on voltage that are a low level are sequentially supplied, so that the data voltages Vdata according to the data signals D1 through Dm are transferred to the fourth node Q4 in each of the sub emission pixels SP2$ij$. In this regard, the data signals D1 through Dm correspond to the current frame.

In the spare pixel circuit DP2, the switching transistor TB2 is turned on by the scan signal Sd of the gate on voltage, and the data signal Dj supplied to the data line DLj is transferred through the switching transistor TB2 that is turned on. Accordingly, the data voltage corresponding to the data signal Dj is stored in the hold capacitor Chold. In this regard, a data signal supplied to the spare pixel circuit DP2 is the same as a data signal supplied to a functioning sub emission pixel (or that was intended to be supplied to a now defective sub emission pixel).

The reference voltage Vref is supplied to another electrode of the hold capacitor Chold. Thus, a voltage value according to a difference in voltages applied to both electrodes is stored in the hold capacitor Chold, thereby storing and maintaining the data voltage of the current frame. The reference voltage Vref may be set as a low level voltage value.

During the emission period Pe1 (which is concurrent with the scan period Ps1), the first power voltage ELVDD is supplied at a high level voltage while the second power voltage ELVSS is changed to and supplied as a low level voltage. When the second power voltage ELVSS is supplied at a low level voltage, the driving transistor TB1 of the sub emission pixels SP2$ij$ is turned on, and a driving current flows from the first power voltage ELVDD to the OLED. The driving current flows at a current amount corresponding to the data voltage of the previous frame reflected at the first node Q1. Then, the OLED emits light at brightness corresponding to this current amount. During the emission period Pe1, all the sub emission pixels SP2$ij$ of the display area AA concurrently (e.g., simultaneously) emit light.

A length of the emission period Pe1 may be greater than that of the scan period Ps1. The emission period Pe1 may adjust the length by controlling a time at which the second power voltage ELVSS is supplied at a low level voltage in a single frame. In this regard, the emission period Pe1 and the scan period Ps1 may temporally overlap. That is, since the length of the emission period Pe1 is adjusted, the emission period Pe1 and the scan period Ps1 may temporally overlap partially or wholly.

Meanwhile, driving timing of the first through third repair control signals GE1 through GE3 for each section in FIG. 14 is the same as (or substantially similar to) that described with reference to FIG. 10. Operations and functions of the first through third repair transistors G1 through G3 of the repair driving unit DPC2b of the spare pixel circuit DP2 corresponding to the first through third repair control signals GE1 through GE3 are also the same (or substantially similar).

In other words, during the reset, compensation, and transfer periods Pr1, Pth1, and Pt before the emission period Pe1, the first and third repair control signals GE1 and G3 that are supplied to the repair driving unit DPC2b of the spare pixel circuit DP2 are each supplied at a high level voltage, while the second repair control signal GE2 is supplied at a low level voltage. During the emission period Pe1, the second and third repair control signals GE2 and GE3 are each supplied at a high level voltage, while the first repair control signal GE1 is supplied at a low level voltage. Thus, during the emission period Pe1, the second repair transistor G2 remains turned off, thereby preventing the driving current from flowing to the OLED of the dummy emission device DPE2 and the dummy emission device DPE2 from emitting (or simulating the emission of) light.

In addition, the third repair control signal GE3 is supplied at a low level voltage during times t3 and t4 right before a start of the emission period Pe1 (i.e., during the pre-emission period). Thus, between the times t3 and t4, the third repair transistor G3 is turned on. The third repair transistor G3 is diode-connected, thereby initializing a driving voltage of the OLED of the previous frame that is stored in the repair line RLj as a driving voltage of the OLED that currently emits light.

Meanwhile, the first repair transistor G1 of the repair driving unit DPC2b of the spare pixel circuit DP2 is turned on during the emission period Pe1. Accordingly, a driving current is supplied to the emission device PE of each of the repaired sub emission pixels SP2ij, i.e., the OLED, through the repair line RLj electrically connected by using, for example, a laser short. Thus, the defective sub emission pixels SP2ij may also emit light, which reduces or prevents brightness uniformity of the display area AA from deteriorating.

Figure 15:
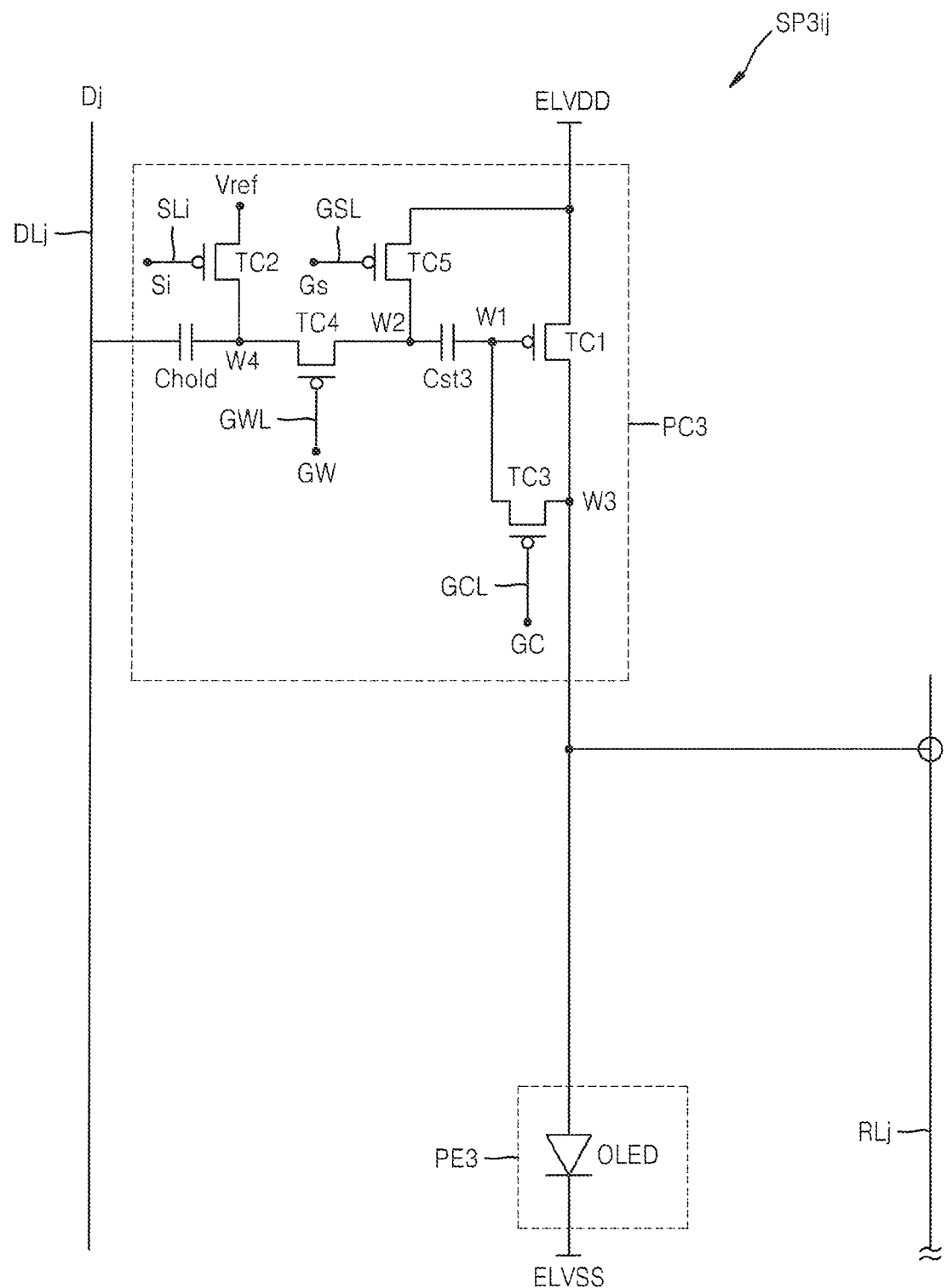
FIG. 15 is a circuit diagram of a sub emission pixel according to yet another embodiment of the present invention.

FIG. 15 is a circuit diagram of a sub emission pixel SP3ij according to yet another embodiment of the present invention.

The sub emission pixel SP3ij of FIG. 15 is included in the emission pixel EPij that is coupled to the scan line SLi of an ith pixel row and the data line DLj of a jth pixel column. The sub emission pixel SP3ij may be the red sub emission pixel SPRij, the green sub emission pixel SPGij, or the blue sub emission pixel SPBij. The data line DLj (supplying the data signal Dj) may be the red data line DLj_R that supplies the red data signal DJ_R, the green data line DLj_G that supplies the green data signal Dj_G, or the blue data line DLj_B that supplies the blue data signal Dj_B according to the sub emission pixel SP3ij.

The sub emission pixel SP3ij includes a driving unit PC3 and an emission device PE3. The emission device PE3 is normally insulated from the repair line RLj. When the emission device PE3 is repaired, the emission device PE3 may be separated from the driving unit PC3 by, for example, being cut, and coupled to the repair line RLj by using, for example, a laser short.

The driving unit PC3 includes a driving transistor TC1, a switching transistor TC2, a compensation transistor TC3, a relay transistor TC4, a hold transistor TC5, a storage capacitor Cst3, and the hold capacitor Chold. The driving transistor TC1 includes a gate electrode coupled to a first node W1, a first electrode coupled to the first power voltage ELVDD, and a second electrode coupled to a third node W3. The driving transistor TC1 generates a driving current corresponding to a data voltage (corresponding to the data signal Dj) supplied to the first node W1 and supplies the driving current to an OLED of the emission device PE3.

The switching transistor TC2 includes a gate electrode coupled to the scan line SLi, a first electrode coupled to a power unit that supplies the reference voltage Vref, and a second electrode coupled to a fourth node W4. The switching transistor TC2 is turned on by the scan signal Si that is supplied through the scan line SLi and transfers the reference voltage Vref to the fourth node W4.

A first electrode of the hold capacitor Chold is coupled to the fourth node W4, and a second electrode thereof is coupled to the data line DLj. Thus, the hold capacitor Chold stores a voltage value due to a difference between the data voltage according to the data signal Dj supplied through the data line DLj and the reference voltage Vref supplied to the fourth node W4 to maintain the data voltage.

Meanwhile, the relay transistor TC4 includes a gate electrode coupled to the second control line GWL, a first electrode coupled to the fourth node W4, and a second electrode coupled to the second node W2. The relay transistor TC4 is turned on by the second control signal GW supplied through the second control line GWL and transfers the data voltage of the hold capacitor Chold to the second node W2.

The second node W2 is coupled to a second electrode of the storage capacitor Cst3, and a first electrode of the storage capacitor Cst3 is coupled to the first node W1. Thus, a value of voltage supplied to the first node W1 varies with respect to a voltage variation value of the second node W2 due to a coupling effect of the storage capacitor Cst3.

The hold transistor TC5 includes a gate electrode coupled to a third control line GSL, a first electrode coupled to the first power voltage ELVDD, and a second electrode coupled to the second node W2. The hold transistor TC5 is turned on by a third control signal GS supplied through the third control line GSL to transfer the first power voltage ELVDD to the second node W2.

Meanwhile, the compensation transistor TC3 includes a gate electrode coupled to the first control line GCL, a first electrode coupled to the first node W1, and a second electrode coupled to the third node W3. The compensation transistor TC3 is turned on by the first control signal GC supplied through the first control line GCL to diode-connect the gate electrode and the second electrode of the driving transistor TC1. The compensation transistor TC3 removes and compensates for a threshold voltage variation of the driving transistor TC1.

Figure 16:
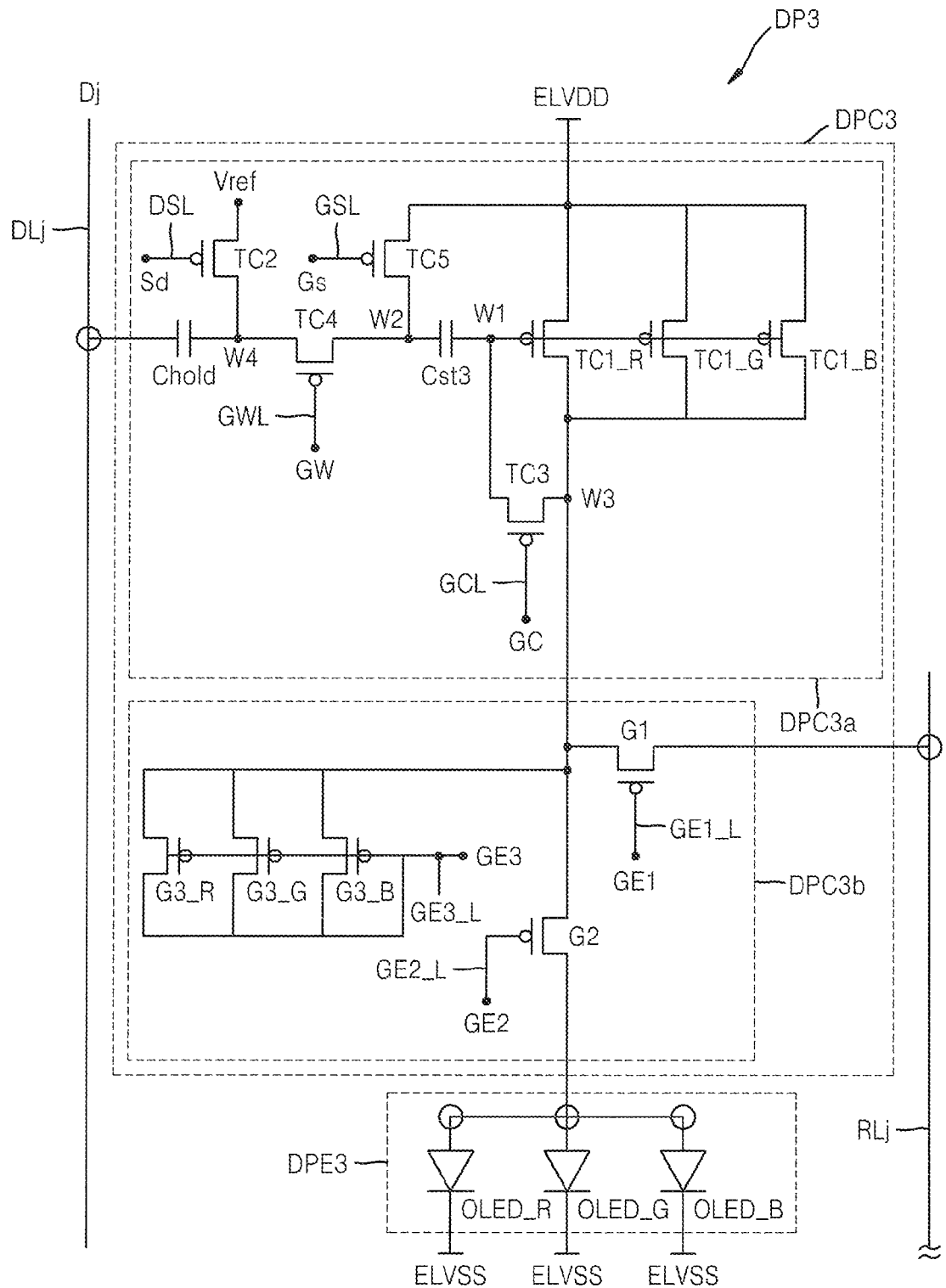
FIG. 16 is a circuit diagram of a spare pixel circuit corresponding to the sub emission pixel of FIG. 15, according to an embodiment of the present invention.

FIG. 16 is a circuit diagram of a spare pixel circuit DP3 corresponding to the sub emission pixel SP3ij of FIG. 15, according to an embodiment of the present invention.

The spare pixel circuit DP3 includes a spare driving unit DPC3 and a dummy emission device DPE3. The spare driving unit DPC3 is coupled to the repair line RLj by using, for example, a laser short when a defective pixel is detected in the display area AA and is electrically connected to an emission device of the defective pixel. The spare driving unit DPC3 may include a first driving unit, such as an emission driving unit DPC3a, and a second driving unit, such as a repair driving unit DPC3b.

The emission driving unit DPC3a is a circuit unit that enables the spare pixel circuit DP3 to perform the function of the driving unit PC3 of the defective sub emission pixel SP3ij, and generates a driving current corresponding to a data signal Dj. The repair driving unit DPC3b is a circuit unit that is coupled to the repair line RLj in the spare pixel circuit DP3 by using, for example, a laser short when the defective pixel is detected in the display area AA, and supplies the driving current generated by the emission driving unit DPC3a to the emission device PE3 of the defective sub emission pixel SP3ij.

The repair driving unit DPC3b and the dummy emission device DPE3 of the spare pixel circuit DP3 of FIG. 16 have the same (or substantially similar) structures as those of FIG. 8. Accordingly, descriptions thereof are not repeated here. The emission driving unit DPC3a of FIG. 16 is the same as (or substantially similar to) the driving unit PC3 of the sub emission pixel SP3ij of FIG. 15 except for a driving transistor TC1. Differences will now be described.

Referring to FIG. 16, the emission driving unit DPC3a of the spare pixel circuit DP3 includes the driving transistor TC1 (represented by first through third driving transistors TC1_R, TC1_B), the switching transistor TC2, the compensation transistor TC3, the relay transistor TC4, the hold transistor TC5, the storage capacitor Cst3, and the hold capacitor Chold. The driving transistor TC1 of the spare pixel circuit DP3 includes a plurality of first through third driving transistors TC1_R, TC1_G, TC1_B that are coupled in parallel to each other. The driving transistor TC1 may include the first driving transistor TC1_R corresponding to a red sub emission pixel, the second driving transistor TC1_G corresponding to a green sub emission pixel, and a third driving transistor TC1_B corresponding to a blue sub mission pixel.

Each of the first through third driving transistors TC1_R, TC1_G, TC1_B includes a gate electrode coupled to the first node W1, a first electrode coupled to the first power voltage ELVDD, and a second electrode coupled to the third node W3. Each of the first through third driving transistors TC1_R, TC1_G, TC1_B generates a driving current corresponding to a data signal supplied to the first node W1.

The switching transistor TC2 includes a gate electrode coupled to the repair scan line DSL, a first electrode coupled to a power supply unit that supplies the reference voltage Vref, and a second electrode coupled to the fourth node W4. The switching transistor TC2 is turned on by the scan signal Sd supplied through the repair scan line DSL to transfer the reference voltage Vref the fourth node W4.

A first electrode of the hold capacitor Chold is coupled to the fourth node W4, and a second electrode thereof is normally insulated from the data line DLj. When the second electrode of the hold capacitor Chold is coupled to the data line DLj, the hold capacitor Chold stores a voltage value due to a difference between a data voltage according to the data signal Dj supplied through the data line DLj and the reference voltage Vref supplied to the fourth node W4 to maintain the data voltage.

Figure 17:
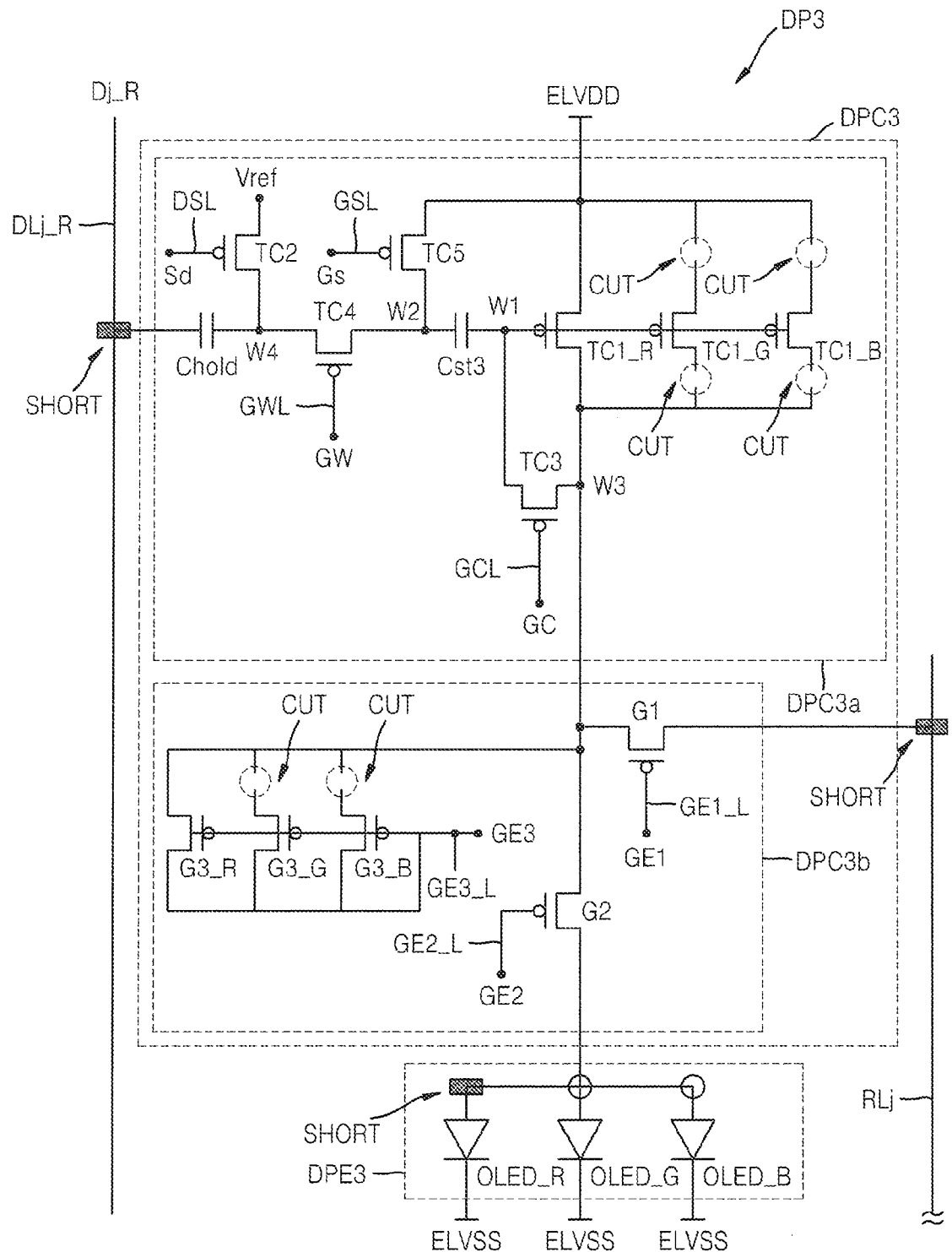
FIG. 17 is a circuit diagram illustrating a method of coupling the spare pixel circuit of FIG. 16 to a repair line, according to an embodiment of the present invention.

FIG. 17 is a circuit diagram illustrating a method of coupling the spare pixel circuit DP3 of FIG. 16 to the repair line RLj, according to an embodiment of the present invention.

FIG. 17 shows the method of repairing the red sub emission pixel SPRij by using the spare pixel circuit DP3 when the red sub emission pixel SPRij included in the emission pixel EPij (that is coupled to the ith scan line SLi and the jth data line DLj) is defective. The driving unit PC_R and the emission device PE_R (see FIG. 5) of the defective red sub emission pixel SPRij are separated by, for example, being cut from each other, and the emission device PE_R is coupled to the repair line RLj by using, for example, a laser short.

The emission driving unit DPC3a of the spare pixel circuit DP3 couples a second electrode of the hold capacitor Chold to the red data line DLj_R that supplies the red data signal Dj_R by using, for example, a laser short. The second driving transistor TC1_G and the third driving transistor TC1_B are separated from the emission driving unit DPC3a by, for example, being cut, leaving the first driving transistor TC1_R corresponding to a red sub emission pixel still functioning. In this regard, at least one of first and second electrodes of the second driving transistor TC1_G and the third driving transistor TC1_B may be cut.

In the repair driving unit DPC3b, the green third repair transistor G3_G and the blue third repair transistor G3_B are separated from the repair driving unit DPC3b, leaving the red third repair transistor G3_R still functioning. In this regard, first electrodes of the green third repair transistor G3_G and the blue third repair transistor G3_B may, for example, be cut. A second electrode of the first repair transistor G1 is coupled to the repair line RLj by using, for example, a laser short. The dummy emission device DPE3 couples an anode of the first OLED OLED_R to the repair driving unit DPC3b by using, for example, a laser short.

The spare pixel circuit DP3 and the red sub emission pixel SPRij are coupled to the repair line RLj as described above. Accordingly, a driving current generated by the spare driving unit DPC3 of the spare pixel circuit DP3 is supplied to the emission device PE_R of the red sub emission pixel SPRij through the repair line RLj to cause the emission device PE_R of the red sub emission pixel SPRij to emit light. Then, even though a pixel is defective, an OLED of the defective pixel normally emits light, thereby reducing or preventing brightness deterioration of the display area AA.

Figure 18:
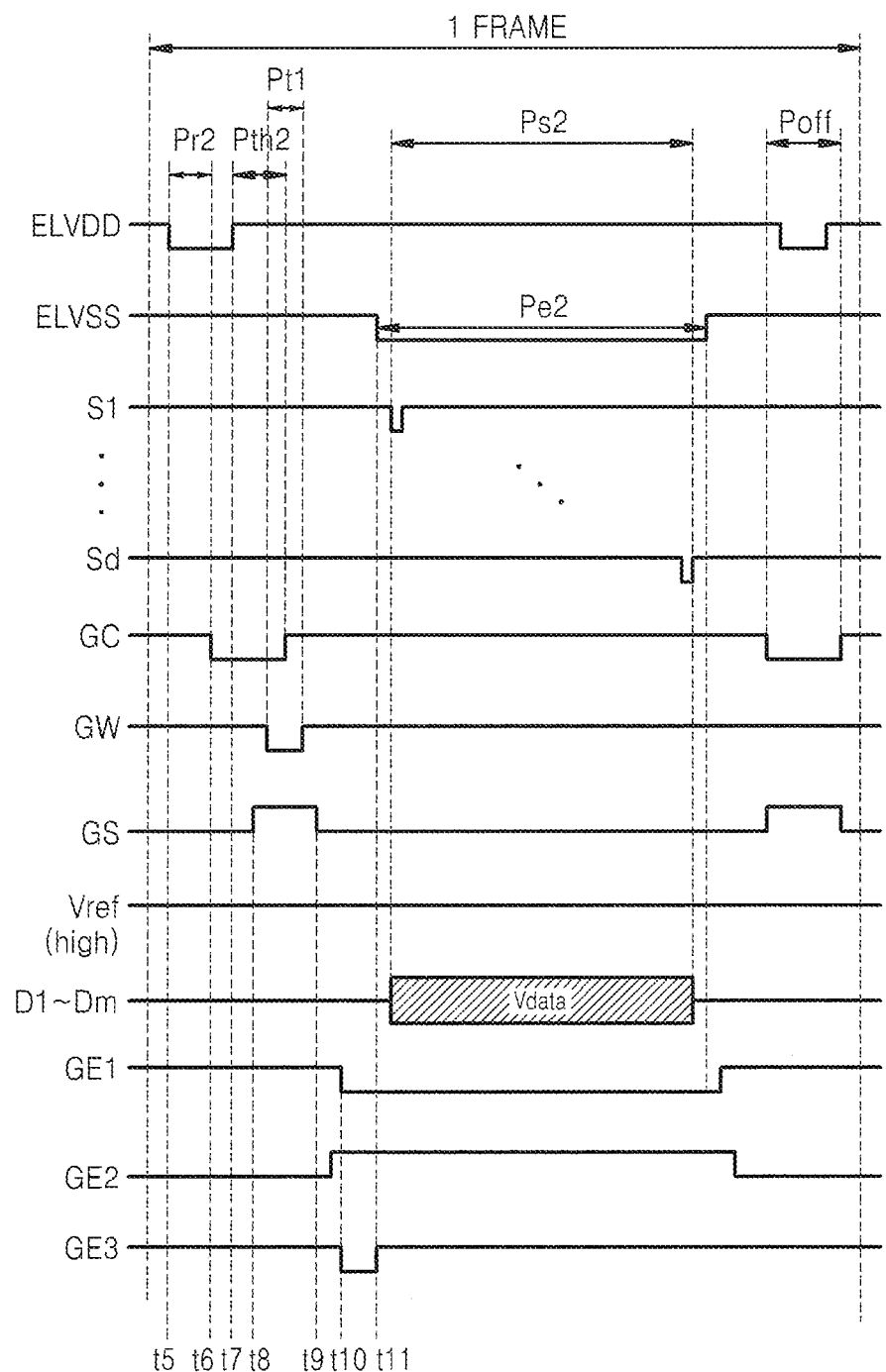
FIG. 18 is a timing diagram illustrating a method of driving the sub emission pixel of FIG. 15 and the spare pixel circuit of FIG. 16, according to an embodiment of the present invention.

FIG. 18 is a timing diagram illustrating a method of driving the sub emission pixel SP3ij of FIG. 15 and the spare pixel circuit DP3 of FIG. 16, according to an embodiment of the present invention. A case where the spare pixel circuit DP3 operates by being coupled to one of the first through third driving transistors TC1_R, TC1_G, and TC1_B, one of the third repair transistors G3_R, G3_G, and G3_B, and one of the first through third OLEDs OLED_R, OLED_G, and OLED_B in response to a repaired sub emission pixel will now be described.

Referring to FIG. 18, the frame period 1 Frame in which a single image is displayed on the display area AA includes a reset period Pr2, a compensation period Pth2 in which a threshold voltage of a driving transistor is compensated for, a transfer period Pt1 in which a previous frame data voltage is transferred to the second node W2 (to cause an appropriate data voltage at the first node W1 for the driving transistor TB1 to drive the emission device PE3 to emit light), a scan period Ps2 in which a current frame data voltage is supplied, an emission period Pe2 that almost overlaps with the scan period Ps2 and in which a plurality of pixels concurrently (e.g., simultaneously) emit light at a driving current amount according to the previous frame data voltages, and a bias period Poff in which pixel response waveforms improve.

During the reset period Pr2 from a time t5 to a time t6, the first power voltage ELVDD is supplied at a low level voltage, the second power voltage ELVSS is supplied at a high level voltage, and the third control signal GS is supplied at a gate on voltage that is a low level so that the hold transistor TC5 is turned on. Consequently, the first power voltage ELVDD of a low level is supplied to the second node W2. A variation value of voltage supplied to the second node W2 changes a voltage of the first node W1 due to a coupling effect of the storage capacitor Cst3. Thus, the driving transistor TC1 is turned on so that current flows to the first power voltage ELVDD from the third node W3. Accordingly, a voltage of the third node W3 is reduced to a low level due to the first power voltage ELVDD. That is, an anode voltage of the OLED is reset to a low level voltage.

At a time t6, the first control signal GC falls from a high level to a low level, and maintains the low level during the compensation period Pth2. During the compensation period Pth2, the first power voltage ELVDD and the second power voltage ELVSS are each supplied at a high level voltage.

The compensation transistor TC3 is turned on by the first control signal GC. Since the compensation transistor TC3 is turned on, the driving transistor TC1 is diode-connected, and a threshold voltage of the driving transistor TC1 is reflected at the first node W1. Accordingly, a voltage reflecting a threshold voltage of the driving transistor TC1 is stored in the storage capacitor Cst3. That is, the threshold voltage of the driving transistor TC1 is compensated for.

Meanwhile, while the threshold voltage of the driving transistor TC1 is compensated for, the third control signal GS rises from a low level to a high level at a time t8, and is maintained at a high level up to a time t9. Accordingly, between the time t8 and the time t9, the hold transistor TC5 is turned off in response to the third control signal GS.

During the transfer period Pt1 between the time t8 and the time t9, the second control signal GW is supplied at a gate on voltage of a low level. Consequently, the relay transistor TC4 is turned on by the second control signal GW of the gate on voltage. The relay transistor TC4 is turned on so that the fourth node W4 and the second node W2 are coupled to each other, and a previous frame data voltage stored in the hold capacitor Chold is transferred to the second node W2 during the transfer period Pt1. Accordingly, a voltage of the first node W1 varies in correspondence with (e.g., by as much as) the change in voltage of the second node W2 to a data voltage due to coupling by the compensation capacitor Cth3. Here, the second power voltage ELVSS is supplied at a high level voltage. Thus, the OLED does not emit light.

During the scan period Ps2, the scan signals S1 through Sn and Sd are sequentially supplied, when the data voltages Vdata according to the data signals D1 through Dm are supplied concurrently (for example, in synchronization) with the scan signals S1 through Sn and Sd. The switching transistor TC2 in each of the sub-emission pixels SP3ij and spare pixel circuits DP3 is turned on by the scan signals S1 through Sn and Sd, and the reference voltage Vref is supplied to the fourth node W4 through the switching transistor TC2 that is turned on.

Meanwhile, during the scan period Ps2, a current frame data voltage is supplied to the first electrode of the hold capacitor Chold through the data line DLj. The first electrode of the hold capacitor Chold is coupled to the fourth node W4. Accordingly, a voltage value corresponding to a difference in voltages applied to both electrodes is stored in the hold capacitor Chold during the scan period Ps2. In this regard, the voltage value corresponds to a difference value between the current frame data voltage and the reference voltage Vref. Consequently, the hold capacitor Chold writes a data voltage according to a data signal corresponding to a current frame. The current frame data voltage written in the hold capacitor Chold is used to control the emission of light in a next frame.

During the emission period Pe2, the second power voltage ELVSS is supplied at a low level voltage while the first power voltage ELVDD is supplied at a high level voltage. Because of the second power voltage ELVSS being supplied at a low level voltage and the driving transistor TC1 being turned on, driving current flows from the first power voltage ELVDD to the OLED. The driving current flows at a current amount corresponding to the previous frame data voltage reflected at the first node W1. During the emission period Pe2, all the sub emission pixels SP3ij of the display area AA concurrently (e.g., simultaneously) emit light. However, the OLED of the spare pixel circuit DP3 does not emit light during the emission period Pe2 (for reasons similar to those described in the previous embodiments above).

During the bias period Poff, the first power voltage ELVDD is supplied at a low level, the second power voltage ELVSS is supplied at a high level, the first control signal GC is supplied at a low level voltage, and the third control signal GS is supplied at a high level voltage. The compensation transistor TC3 is turned on by the first control signal GC, and the hold transistor TC5 is turned off by the third control signal GS.

Accordingly, a voltage of the third node W3 is supplied at the low level voltage of the first power voltage ELVDD by the compensation transistor TC3. As a result, the response waveform of the pixel may improve. The bias period Poff may be omitted.

The timing diagram of FIG. 18 shows pulse voltage levels of the first through third repair control signals GE1 through GE3 that are supplied to the repair driving unit DPC3b of the spare pixel circuits DP3. However, the timing diagram of FIG. 18 is the same as (or substantially similar to) the timing diagrams of FIGS. 10 and 14. Thus, operations and functions of the first through third repair control signals GE1 through GE3 of the repair driving unit DPC3b of the spare pixel circuits DP3 are also the same as (or substantially similar to) those described above. Accordingly, descriptions thereof are not repeated.

Figure 19:
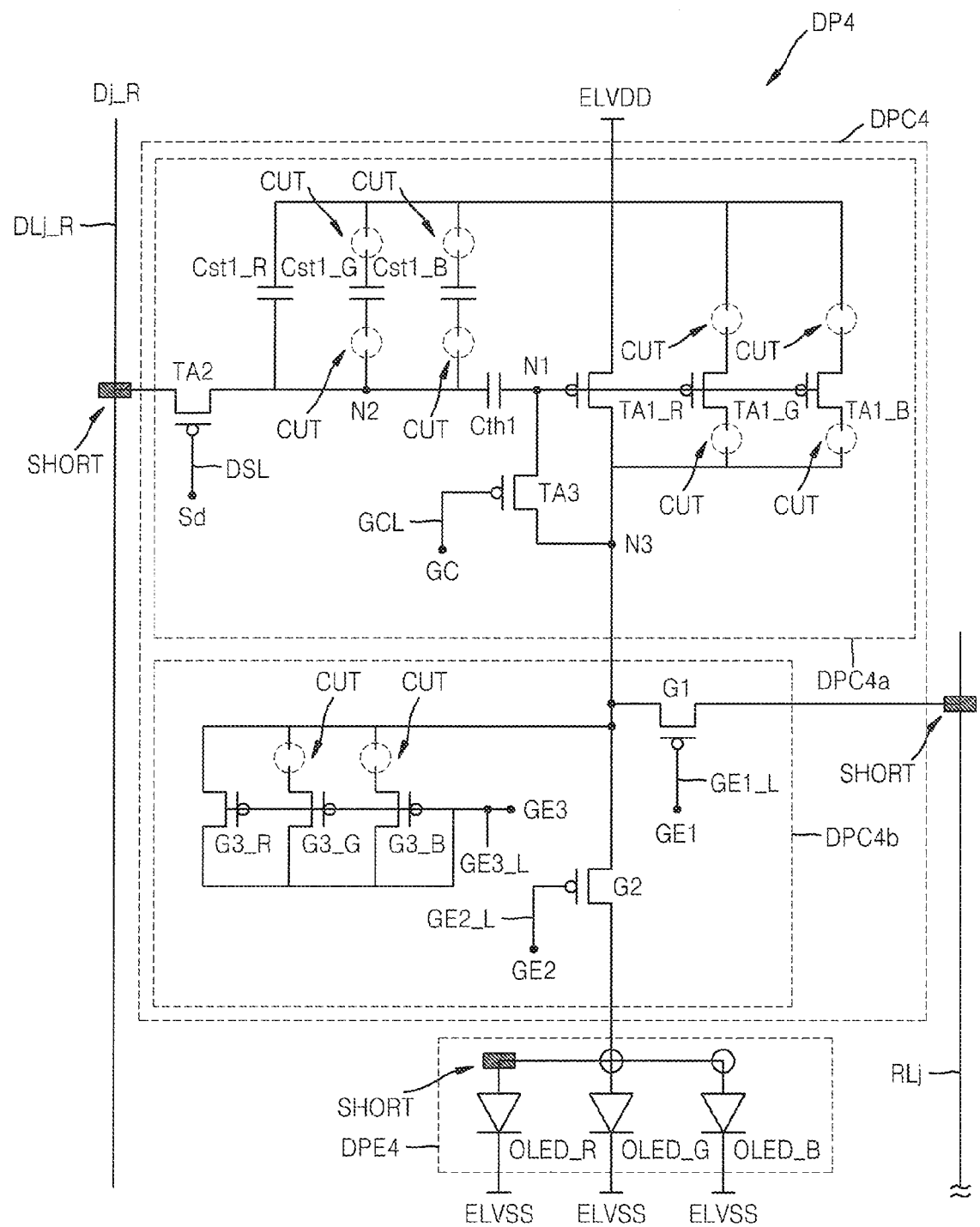
FIGS. 19 through 21 are circuit diagrams of spare pixel circuits according to other embodiments of the present invention.

FIG. 19 is a circuit diagram of a spare pixel circuit DP4 according to another embodiment of the present invention.

The spare pixel circuit DP4 of FIG. 19 is the same as (or substantially similar to) the spare pixel circuit DP1 of FIG. 8 in structure and operation, except for the storage capacitor Cst1 (represented by first through third storage capacitors Cst1_R, Cst1_G, and Cst1_B) of an emission driving unit DPC4a. The storage capacitor Cst1 includes a plurality of first through third storage capacitors Cst1_R, Cst1_G, and Cst1_B that are coupled in parallel to each other. The storage capacitor Cst1 may include the first storage capacitor Cst1_R corresponding to a red sub emission pixel, the second storage capacitor Cst1_G corresponding to a green sub emission pixel, and the third storage capacitor Cst1_B corresponding to a blue sub emission pixel.

When the spare pixel circuit DP4 is coupled to the repair line RLj, storage capacitors Cst1 other than a corresponding storage capacitor according to a repaired sub emission pixel are, for example, cut. In this regard, at least one of first and second electrodes of the first through third storage capacitors Cst1_R, Cst1_G, and Cst1_B may be cut. For example, when the spare pixel circuit DP4 is used to repair the red sub emission pixel SPRij, the second storage capacitor Cst1_G and the third storage capacitor Cst1_B may be cut, leaving the first storage capacitor Cst1_R still functioning. In a similar fashion, the compensation capacitor Cth1 may be implemented as first through third compensation capacitors Cth1_R, Cth1_G, and Cth1_B to correspond to sub emission pixels of different colors.

Figure 20:
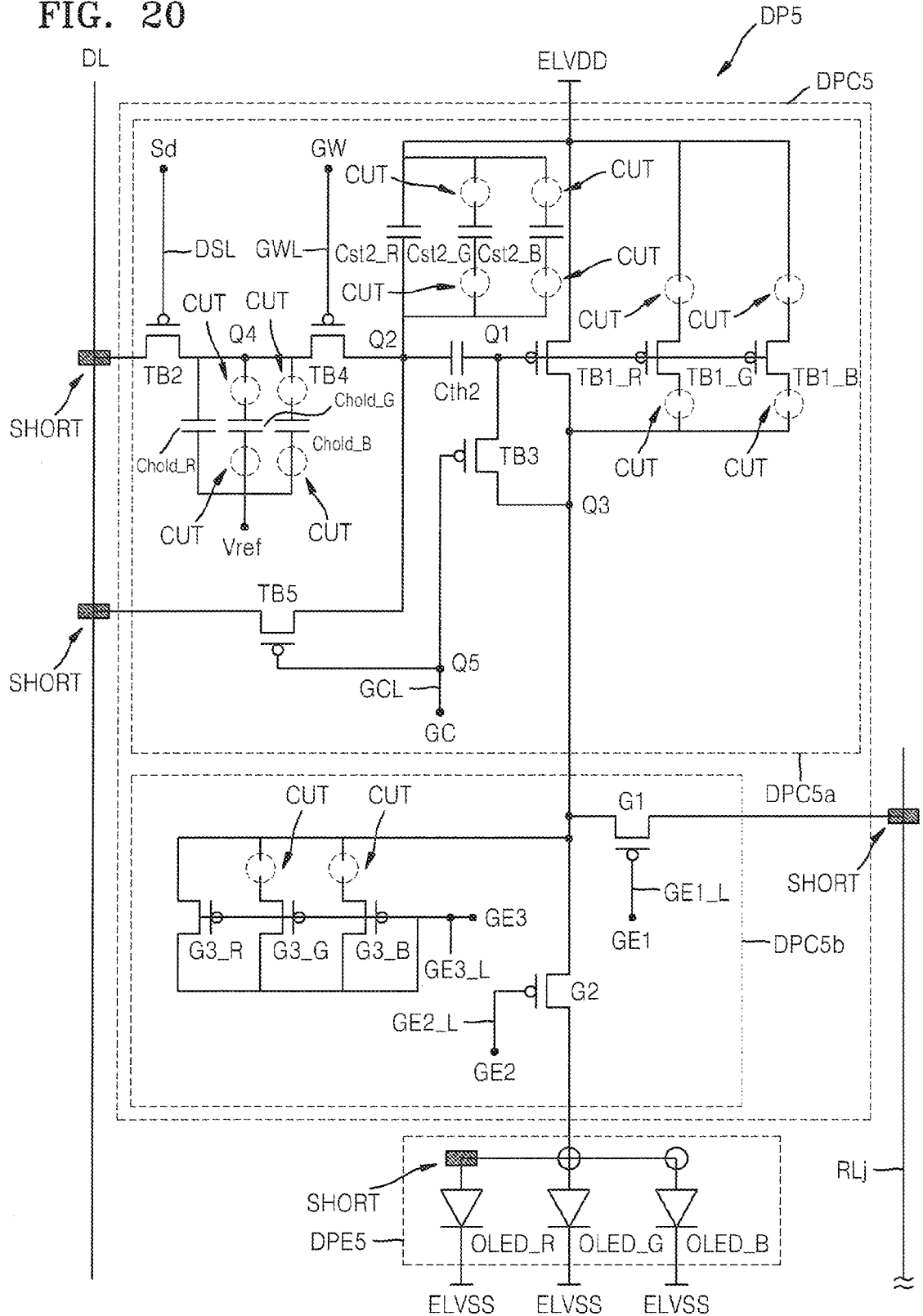

FIG. 20 is a circuit diagram of a spare pixel circuit DP5 according to yet another embodiment of the present invention.

The spare pixel circuit DP5 of FIG. 20 is the same as (or substantially similar to) the spare pixel circuit DP2 of FIG. 12 in structure and operation, except for the storage capacitor Cst2 (represented by first through third storage capacitors Cst2_R, Cst2_G, and Cst2_B) and hold capacitor Chold (represented by first through third hold capacitors Chold_R, Chold_G, and Chold_B) of an emission driving unit DPC5a. The storage capacitor Cst2 includes a plurality of first through third storage capacitors Cst2_R, Cst2_G, and Cst2_B that are coupled in parallel to each other. The storage capacitor Cst2 may include the first storage capacitor Cst2_R corresponding to a red sub emission pixel, the second storage capacitor Cst2_G corresponding to a green sub emission pixel, and the third storage capacitor Cst2_B corresponding to a blue sub emission pixel.

When the spare pixel circuit DP5 is coupled to the repair line RLj, storage capacitors Cst2 other than a corresponding storage capacitor according to a repaired sub emission pixel are, for example, cut. In this regard, at least one of first and second electrodes of the first through third storage capacitors Cst2_R, Cst2_G, and Cst2_B may be cut. For example, when the spare pixel circuit DP5 is used to repair the red sub emission pixel SPRij, the second storage capacitor Cst2_G and the third storage capacitor Cst2_B may be cut, leaving the first storage capacitor Cst2_R still functioning.

The hold capacitor Chold includes a plurality of first through third hold capacitors Chold_R, Chold_G, and Chold_B that are coupled in parallel to each other. The hold capacitor Chold may include the first hold capacitor Chold_R corresponding to the red sub emission pixel, the second hold capacitor Chold_G corresponding to the green sub emission pixel, and the third hold capacitor Chold_B corresponding to the blue sub emission pixel.

When the spare pixel circuit DP5 is coupled to the repair line RLj, hold capacitors other than a corresponding hold capacitor according to the repaired sub emission pixel are, for example, cut. In this regard, at least one of first and second electrodes of the first through third hold capacitors Chold_R, Chold_G, and Chold_B may be cut. For example, when the spare pixel circuit DP5 is used to repair the red sub emission pixel SPR, the second hold capacitor Chold_G and the third hold capacitor Chold_B may be cut, leaving the first hold capacitor Chold_R still functioning. In a similar fashion, the compensation capacitor Cth2 may be implemented as first through third compensation capacitors Cth2_R, Cth2_G, and Cth2_B to correspond to sub emission pixels of different colors.

Figure 21:
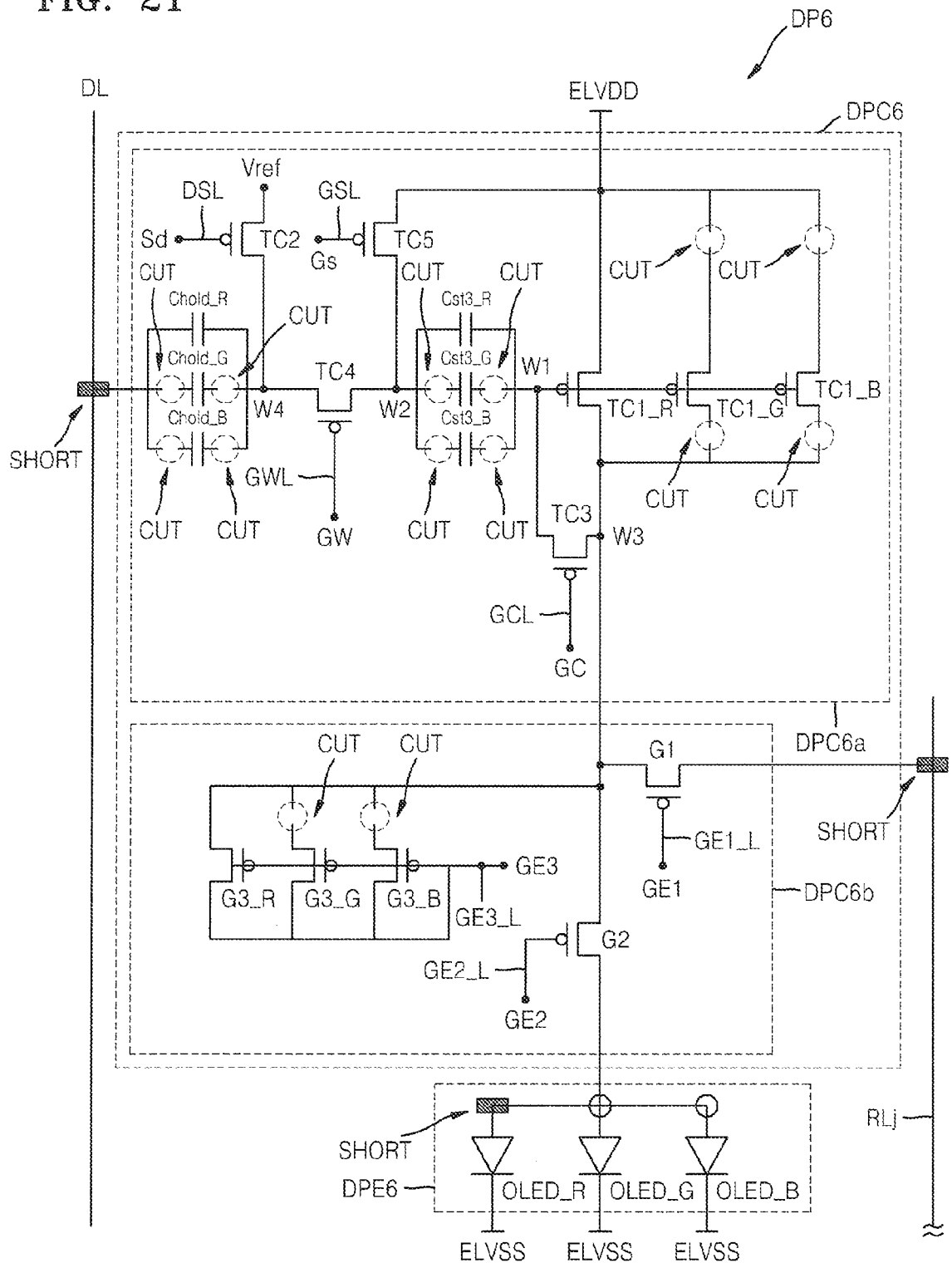

FIG. 21 is a circuit diagram of a spare pixel circuit DP6 according to still yet another embodiment of the present invention.

The spare pixel circuit DP6 of FIG. 21 is the same as (or substantially similar to) the spare pixel circuit DP3 of FIG. 16 in structure and operation, except for the storage capacitor Cst3 (represented by first through third storage capacitors Cst3_R, Cst3_G, and Cst3_B) and hold capacitor Chold (represented by first through third hold capacitors Chold_R, Chold_G, and Chold_B) of an emission driving unit DPC6a. The storage capacitor Cst3 includes a plurality of first through third storage capacitors Cst3_R, Cst3_G, and Cst3_B that are coupled in parallel to each other. The storage capacitor Cst3 may include the first storage capacitor Cst3_R corresponding to a red sub emission pixel, the second storage capacitor Cst3_G corresponding to a green sub emission pixel, and the third storage capacitor Cst3_B corresponding to a blue sub emission pixel.

When the spare pixel circuit DP6 is coupled to the repair line RLj, storage capacitors Cst3 other than a corresponding storage capacitor according to a repaired sub emission pixel are, for example, cut. In this regard, at least one of first and second electrodes of the first through third storage capacitors Cst3_R, Cst3_G, and Cst3_B may be cut. For example, when the spare pixel circuit DP6 is used to repair the red sub emission pixel SPRij, the second storage capacitor Cst3_G and the third storage capacitor Cst3_B may be cut, leaving the first storage capacitor Cst3_R still functioning.

The hold capacitor Chold includes the plurality of first through third hold capacitors Chold_R, Chold_G, and Chold_B that are coupled in parallel to each other. The hold capacitor Chold may include the first hold capacitor Chold_R corresponding to the red sub emission pixel, the second hold capacitor Chold_G corresponding to the green sub emission pixel, and the third hold capacitor Chold_B corresponding to the blue sub emission pixel.

When the spare pixel circuit DP6 is coupled to the repair line RLj, hold capacitors other than a corresponding hold capacitor according to the repaired sub emission pixel are, for example, cut. In this regard, at least one of first and second electrodes of the first through third hold capacitors Chold_R, Chold_G, and Chold_B may be cut. For example, when the spare pixel circuit DP6 is used to repair the red sub emission pixel SPRij, the second hold capacitor Chold_G and the third hold capacitor Chold_B may be cut, leaving the first hold capacitor Chold_R still functioning.

Figure 22:
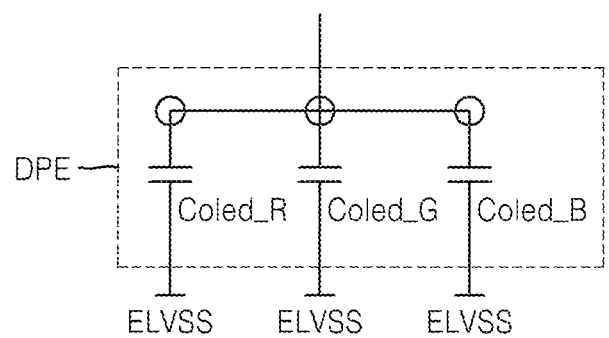
FIG. 22 is a diagram of a dummy emission device according to an embodiment of the present invention.

FIG. 22 is a diagram of the dummy emission device DPE according to an embodiment of the present invention.

Referring to FIG. 22, the dummy emission device DPE includes first through third capacitors Coled_R, Coled_G, and Coled_B instead of an OLED. First electrodes of the first through third capacitors Coled_R, Coled_G, and Coled_B are normally insulated from the spare driving unit DPC, and second electrodes thereof are coupled to the second power voltage ELVSS. The first electrodes of the first through third capacitors Coled_R, Coled_G, and Coled_B may be coupled to a corresponding capacitor according to a sub emission pixel that is repaired by using, for example, a laser short. Unlike the embodiment of FIG. 22, in other embodiments, the first through third capacitors Coled_R, Coled_G, and Coled_B may be coupled to the spare driving unit DPC, and capacitors other than a corresponding capacitor may be separated by using, for example, a laser cut in repair.

As described above, according to the one or more of the above embodiments of the present invention, when a unit emission pixel includes a plurality of sub emission pixels, among circuit devices of a spare pixel circuit for repair, a plurality of circuit devices having different characteristics for each sub emission pixel correspond to the plurality of sub emission pixels. Only a circuit device corresponding to a repaired sub emission pixel may operate. Accordingly, there is no need for a plurality of spare pixel circuits corresponding to the sub emission pixels, thereby reducing dead space. A single spare pixel circuit may have the same characteristic as that of the repaired sub emission pixel among the sub emission pixels.

According to the one or more of the above embodiments of the present invention, types of transistors included in a pixel are PMOS transistors but are not limited thereto. Transistors may be, for example, NMOS transistors in other embodiments.

The above embodiments of the present invention are not limited to the above-described pixel structures. Diverse pixels such as the spare pixel circuits above may be used to repair a bright spot or a dark spot of a defective pixel due to a defective pixel circuit. Thus, pixels may emit light without a brightness loss. In addition, defective pixels may be used as normal pixels through a process of repairing the defective pixels, thereby increasing yield.

It should be understood that the exemplary embodiments described herein should be considered in a descriptive sense only and not for purposes of limitation. Descriptions of features or aspects within each embodiment should be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and their equivalents.

What is claimed is:

1. An organic light-emitting display apparatus comprising:
    an emission pixel in a display area and comprising a plurality of sub emission pixels each comprising a driving unit for generating a driving current corresponding to input data signals and an emission device for emitting light by using the driving current; and
    a spare pixel circuit in a repair area outside the display area, coupled to a repair line that is coupled to the emission device of one of the sub emission pixels, and comprising a plurality of driving transistors corresponding to the plurality of sub emission pixels.

2. The organic light-emitting display apparatus of claim 1, wherein the spare pixel circuit comprises:
    a first driving unit for generating the driving current corresponding to the input data signals;
    a second driving unit for transferring the driving current from the first driving unit to the emission device coupled to the repair line; and
    a plurality of dummy emission devices corresponding to the plurality of sub emission pixels.

3. The organic light-emitting display apparatus of claim 2, wherein the first driving unit comprises:
    the plurality of driving transistors, one of the driving transistors corresponding to the one of the sub emission pixels and comprising a gate electrode coupled to a first node, a first electrode coupled to a first power voltage source, and a second electrode coupled to a third node;
    a switching transistor comprising a gate electrode coupled to a scan line, a first electrode coupled to a data line, and a second electrode coupled to a second node;
    a compensation transistor comprising a gate electrode coupled to a first control line, a first electrode coupled to the first node, and a second electrode coupled to the third node;
    a storage capacitor comprising a first electrode coupled to the first power voltage source and a second electrode coupled to the second node; and
    a compensation capacitor comprising a first electrode coupled to the first node and a second electrode coupled to the second node.

4. The organic light-emitting display apparatus of claim 3, wherein the plurality of driving transistors, excluding the one of the driving transistors, are disabled.

5. The organic light-emitting display apparatus of claim 3, wherein the storage capacitor comprises a plurality of storage capacitors corresponding to the plurality of sub emission pixels, one of the storage capacitors corresponding to the one of the sub emission pixels and comprising the first electrode coupled to the first power voltage source and the second electrode coupled to the second node, and
    wherein the plurality of storage capacitors, excluding the one of the storage capacitors, are disabled.

6. The organic light-emitting display apparatus of claim 2, wherein the second driving unit comprises:
    a first repair transistor configured to turn on during an emission period of the emission pixel and electrically connect the first driving unit and the repair line;
    a second repair transistor between the first driving unit and the dummy emission devices, and configured to turn on during a non-emission period of the emission pixel and turn off during the emission period of the emission pixel; and
    a third repair transistor configured to turn on during a pre-emission period just before the emission period and initialize a driving voltage of a previous frame supplied to the repair line.

7. The organic light-emitting display apparatus of claim 6, wherein the third repair transistor comprises a plurality of third repair transistors corresponding to the plurality of sub emission pixels, one of the third repair transistors corresponding to the one of the sub emission pixels and being configured to turn on during the pre-emission period and initialize the driving voltage of the previous frame supplied to the repair line, and
    wherein the plurality of third repair transistors, excluding the one of the third repair transistors, are disabled.

8. The organic light-emitting display apparatus of claim 6, wherein the first repair transistor comprises a gate electrode coupled to a first repair control line, a first electrode coupled to the first driving unit, and a second electrode coupled to the repair line,
    wherein the second repair transistor comprises a gate electrode coupled to a second repair control line, a first electrode coupled to the first driving unit, and a second electrode coupled to the dummy emission devices, and
    wherein the third repair transistor comprises a gate electrode coupled to a third repair control line, a first electrode coupled to the first driving unit, and a second electrode coupled to the gate electrode of the third repair transistor.

9. The organic light-emitting display apparatus of claim 2, wherein the first driving unit comprises:
    the plurality of driving transistors, one of the driving transistors corresponding to the one of the sub emission pixels and comprising a gate electrode coupled to a first node, a first electrode coupled to a first power voltage source, and a second electrode coupled to a third node;
    a switching transistor comprising a gate electrode coupled to a scan line, a first electrode coupled to a data line, and a second electrode coupled to a fourth node;
    a compensation transistor comprising a gate electrode coupled to a first control line, a first electrode coupled to the first node, and a second electrode coupled to the third node;
    a relay transistor comprising a gate electrode coupled to a second control line, a first electrode coupled to the fourth node, and a second electrode coupled to a second node;
    a hold transistor comprising a gate electrode coupled to the first control line, a first electrode coupled to the data line, and a second electrode coupled to the second node;
    a storage capacitor comprising a first electrode coupled to the first power voltage source and a second electrode coupled to the second node;
    a compensation capacitor comprising a first electrode coupled to the first node and a second electrode coupled to the second node; and
    a hold capacitor comprising a first electrode coupled to the fourth node and a second electrode coupled to a reference voltage source.

10. The organic light-emitting display apparatus of claim 9, wherein the plurality of driving transistors, excluding the one of the driving transistors, are disabled.

11. The organic light-emitting display apparatus of claim 9, wherein the storage capacitor comprises a plurality of storage capacitors corresponding to the plurality of sub emission pixels, one of the storage capacitors corresponding to the one of the sub emission pixels and comprising the first electrode coupled to the first power voltage source and the second electrode coupled to the second node, wherein the hold capacitor comprises a plurality of hold capacitors corresponding to the plurality of sub emission pixels, one of the hold capacitors corresponding to the one of the sub emission pixels and comprising the first electrode coupled to the fourth node and the second electrode coupled to the reference voltage source, wherein the plurality of storage capacitors, excluding the one of the storage capacitors, are disabled, and wherein the plurality of hold capacitors, excluding the one of the hold capacitors, are disabled.

12. The organic light-emitting display apparatus of claim 2, wherein the first driving unit comprises:
the plurality of driving transistors, one of the driving transistors corresponding to the one of the sub emission pixels and comprising a gate electrode coupled to a first node, a first electrode coupled to a first power voltage source, and a second electrode coupled to a third node;
a switching transistor comprising a gate electrode coupled to a scan line, a first electrode coupled to a reference voltage source, and a second electrode coupled to a fourth node;
a compensation transistor comprising a gate electrode coupled to a first control line, a first electrode coupled to the first node, and a second electrode coupled to the third node;
a relay transistor comprising a gate electrode coupled to a second control line, a first electrode coupled to the fourth node, and a second electrode coupled to a second node;
a hold transistor comprising a gate electrode coupled to a third control line, a first electrode coupled to the first power voltage source, and a second electrode coupled to the second node;
a storage capacitor comprising a first electrode coupled to the first node and a second electrode coupled to the second node; and
a hold capacitor comprising a first electrode coupled to a data line and a second electrode coupled to the fourth node.

13. The organic light-emitting display apparatus of claim 12, wherein the plurality of driving transistors, excluding the one of the driving transistors, are disabled.

14. The organic light-emitting display apparatus of claim 12,
wherein the storage capacitor comprises a plurality of storage capacitors corresponding to the plurality of sub emission pixels, one of the storage capacitors corresponding to the one of the sub emission pixels and comprising the first electrode coupled to the first node and the second electrode coupled to the second node,
wherein the hold capacitor comprises a plurality of hold capacitors corresponding to the plurality of sub emission pixels, one of the hold capacitors corresponding to the one of the sub emission pixels and comprising the first electrode coupled to the data line and the second electrode coupled to the reference voltage source,
wherein the plurality of storage capacitors, excluding the one of the storage capacitors, are disabled, and
wherein the plurality of hold capacitors, excluding the one of the hold capacitors, are disabled.

15. An organic light-emitting display apparatus comprising:
an emission pixel comprising a plurality of sub emission pixels each comprising a driving unit for generating a driving current corresponding to input data signals, and an emission device configured to emit light by using the driving current;
a spare pixel circuit comprising:
a first driving unit comprising a plurality of driving transistors corresponding to the plurality of sub emission pixels;
a second driving unit for controlling a current path between the first driving unit and an emission device of one of the sub emission pixels; and
a plurality of dummy emission devices corresponding to the plurality of sub emission pixels, one of the dummy emission devices corresponding to the one of the sub emission pixels being insulated from, and configured to be electrically connected to, the second driving unit; and
a repair line insulated from, and configured to be electrically connected to, the spare pixel circuit and the emission device of the one of the sub emission pixels.

16. The organic light-emitting display apparatus of claim 15,
wherein the emission pixel is in a display area,
wherein the spare pixel circuit is in a repair area outside the display area,
wherein the spare pixel circuit is coupled to a repair scan line in the repair area, and
wherein the repair scan line is a scan line before a first scan line or after a last scan line among a plurality of scan lines of the display area.

17. An organic light-emitting display apparatus comprising:
an emission pixel comprising a plurality of sub emission pixels each comprising a driving unit for generating a driving current corresponding to input data signals, and an emission device configured to emit light by using the driving current;
a spare pixel circuit comprising:
a first driving unit comprising a plurality of driving transistors corresponding to the plurality of sub emission pixels;
a second driving unit for controlling a current path between the first driving unit and an emission device of one of the sub emission pixels; and
a plurality of dummy emission devices corresponding to the plurality of sub emission pixels, one of the dummy emission devices corresponding to the one of the sub emission pixels being electrically connected to the second driving unit; and
a repair line electrically connected to the spare pixel circuit and the emission device of the one of the sub emission pixels.

18. The organic light-emitting display apparatus of claim 17,
wherein the one of the sub emission pixels is a defective sub emission pixel,
wherein the second driving unit is electrically connected to the repair line,
wherein the plurality of driving transistors, excluding one of the driving transistors corresponding to the defective sub emission pixel, are disabled, and
wherein the second driving unit is configured to supply a driving current from the one of the driving transistors to the repair line.

19. The organic light-emitting display apparatus of claim 17,
wherein the one of the sub emission pixels is a defective sub emission pixel, wherein the first driving unit comprises a plurality of capacitors corresponding to the plurality of sub emission pixels, wherein the plurality of capacitors, excluding one of the capacitors corresponding to the defective sub emission pixel, are disabled.

20. The organic light-emitting display apparatus of claim 17, wherein the second driving unit comprises:
- a first repair transistor configured to turn on during an emission period of the emission pixel and electrically connect the first driving unit to the repair line;
- a second repair transistor between the first driving unit and the dummy emission devices, and configured to turn on during a non-emission period of the emission pixel and to turn off during the emission period of the emission pixel; and
- a third repair transistor configured to turn on during a pre-emission period just before the emission period and to initialize a driving voltage of a previous frame supplied to the repair line.

* * * * *